United States Patent
Zeine et al.

(10) Patent No.: US 11,901,366 B2
(45) Date of Patent: *Feb. 13, 2024

(54) FLAT PANEL SUBSTRATE WITH INTEGRATED ANTENNAS AND WIRELESS POWER TRANSMISSION SYSTEM

(71) Applicant: Ossia Inc., Redmond, WA (US)

(72) Inventors: Hatem Ibrahim Munir Zeine, Woodinville, WA (US); Douglas Wayne Williams, Seattle, WA (US); Adam W. Oster, Snoqualmie, WA (US)

(73) Assignee: Ossia Inc., Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/167,759

(22) Filed: Feb. 10, 2023

(65) Prior Publication Data

US 2023/0187450 A1 Jun. 15, 2023

Related U.S. Application Data

(60) Continuation of application No. 17/478,861, filed on Sep. 17, 2021, now Pat. No. 11,594,554, which is a
(Continued)

(51) Int. Cl.
*H01L 27/12* (2006.01)
*H02J 50/23* (2016.01)
(Continued)

(52) U.S. Cl.
CPC ........ *H01L 27/1214* (2013.01); *H01L 23/552* (2013.01); *H01L 23/66* (2013.01);
(Continued)

(58) Field of Classification Search
CPC .................................................. H01L 27/1214
(Continued)

(56) References Cited

U.S. PATENT DOCUMENTS 5,835,062 A * 11/1998 Heckaman ............... H01Q 3/46
343/840
8,115,696 B2 2/2012 Skalina et al.
(Continued)

FOREIGN PATENT DOCUMENTS

WO 2015126550 A1 8/2015
WO 2016141340 A1 9/2016

OTHER PUBLICATIONS

International Search Report and Written Opinion dated Jul. 5, 2018 for PCT Application No. PCT/US18/29477, 17 pages.
(Continued)

*Primary Examiner* — Yalkew Fantu
(74) *Attorney, Agent, or Firm* — Amin, Turocy & Watson, LLP

(57) ABSTRACT

A flat panel substrate with integrated antennas and wireless power transmission system for delivering power to a receiving device is presented herein. A method can comprise depositing, onto a flat panel substrate, an antenna layer comprising multiple adaptively phased antennas elements; and depositing, onto the flat panel substrate, respective thin film transistor (TFT)-based antenna management circuits for the multiple adaptively phased antenna elements—the respective TFT-based antenna management circuits being operable to measure respective first phases at which first signals are received at the multiple adaptively phased antenna elements, and based on the respective first phases, control respective second phases at which second signals are transmitted from the multiple adaptively phased antenna elements to facilitate delivery, via the second signals, of power to the receiving device. Further, the method comprises forming traces communicatively coupling the multiple adaptively phased antenna elements to the respective TFT-based antenna management circuits.

20 Claims, 22 Drawing Sheets

Related U.S. Application Data division of application No. 15/950,160, filed on Apr. 10, 2018, now Pat. No. 11,139,695.

(60) Provisional application No. 62/629,220, filed on Feb. 12, 2018.

(51) Int. Cl.
| | | |
|---|---|---|
| *H01Q 21/06* | (2006.01) | |
| *H01L 23/66* | (2006.01) | |
| *H01L 23/552* | (2006.01) | |
| *H02J 50/40* | (2016.01) | |

(52) U.S. Cl.
CPC ........ *H01L 27/124* (2013.01); *H01L 27/1262* (2013.01); *H01Q 21/061* (2013.01); *H02J 50/23* (2016.02); *H02J 50/402* (2020.01); *H01L 2223/6616* (2013.01); *H01L 2223/6677* (2013.01)

(58) Field of Classification Search
USPC ........................................ 320/108
See application file for complete search history.

(56) References Cited

U.S. PATENT DOCUMENTS

| | | | |
|---|---|---|---|
| 9,780,451 B2 | 10/2017 | Stevenson et al. | |
| 9,786,986 B2 | 10/2017 | Johnson et al. | |
| 9,887,455 B2 | 2/2018 | Sazegar et al. | |
| 9,887,456 B2 | 2/2018 | Bily et al. | |
| 9,893,435 B2 | 2/2018 | Bily et al. | |
| 11,594,554 B2* | 2/2023 | Zeine | H01L 27/1262 |
| 2004/0201526 A1 | 10/2004 | Knowles et al. | |
| 2010/0099276 A1 | 4/2010 | Capeleto et al. | |
| 2013/0082647 A1 | 4/2013 | Yoon et al. | |
| 2015/0222014 A1 | 8/2015 | Stevenson et al. | |
| 2015/0222021 A1 | 8/2015 | Stevenson et al. | |
| 2015/0222022 A1 | 8/2015 | Kundtz et al. | |
| 2015/0236415 A1 | 8/2015 | Bily et al. | |
| 2016/0033254 A1 | 2/2016 | Zeine et al. | |
| 2016/0099500 A1 | 4/2016 | Kundtz et al. | |
| 2016/0241217 A1 | 8/2016 | Sazegar et al. | |
| 2016/0248270 A1 | 8/2016 | Zeine et al. | |
| 2016/0261042 A1* | 9/2016 | Sazegar | H01Q 21/064 |
| 2016/0365754 A1* | 12/2016 | Zeine | H04B 7/0613 |
| 2017/0170557 A1 | 6/2017 | Shipton et al. | |
| 2017/0170572 A1 | 6/2017 | Severson et al. | |
| 2017/0187100 A1 | 6/2017 | Fotheringham et al. | |
| 2017/0187101 A1 | 6/2017 | Freeman et al. | |
| 2017/0254903 A1 | 9/2017 | Johnson et al. | |
| 2017/0256865 A1 | 9/2017 | Sikes et al. | |
| 2017/0301475 A1 | 10/2017 | Stevenson et al. | |
| 2017/0302004 A1 | 10/2017 | Stevenson et al. | |
| 2017/0324148 A1 | 11/2017 | Stevenson et al. | |
| 2017/0331186 A1 | 11/2017 | Linn et al. | |
| 2017/0338540 A1 | 11/2017 | Fotheringham et al. | |
| 2017/0338569 A1 | 11/2017 | Hower et al. | |
| 2017/0346176 A1 | 11/2017 | Linn et al. | |

OTHER PUBLICATIONS

Office Action dated Feb. 19, 2021 for U.S. Appl. No. 15/950,160, 27 pages.

Notice of Allowance dated Oct. 21, 2022 for U.S. Appl. No. 17/478,861, 30 pages.

* cited by examiner

FLAT PANEL SUBSTRATE WITH INTEGRATED ANTENNAS AND WIRELESS POWER TRANSMISSION SYSTEM

RELATED APPLICATIONS

The subject patent application is a continuation of, and claims priority to each of, U.S. patent application Ser. No. 17/478,861, filed Sep. 17, 2021, and entitled "FLAT PANEL SUBSTRATE WITH INTEGRATED ANTENNAS AND WIRELESS POWER TRANSMISSION SYSTEM", which is a divisional of U.S. patent application Ser. No. 15/950,160 (now U.S. Pat. No. 11,139,695), filed Apr. 10, 2018, and entitled "FLAT PANEL SUBSTRATE WITH INTEGRATED ANTENNAS AND WIRELESS POWER TRANSMISSION SYSTEM", each of which applications claim further priority to U.S. Provisional Patent Application No. 62/629,220, filed on Feb. 12, 2018, entitled "FLAT PANEL SUBSTRATE WITH INTEGRATED ANTENNAS AND MANAGEMENT CONTROL CIRCUITRY", the entireties of which priority applications are hereby incorporated by reference herein.

TECHNICAL FIELD

The subject disclosure generally relates to embodiments corresponding to a flat panel substrate with integrated antennas and wireless power transmission system.

BACKGROUND

Conventional wireless power transmission systems can wirelessly deliver power to devices via inductive charging. However, it has been prohibitively burdensome and expensive for conventional power transmission technologies to transmit power via radio frequency (RF) means as such transmission requires use of many antennas and microchip control circuits. Consequently, conventional wireless power transmission technologies have had some drawbacks, some of which may be noted with reference to the various embodiments described herein below.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Figure 1:
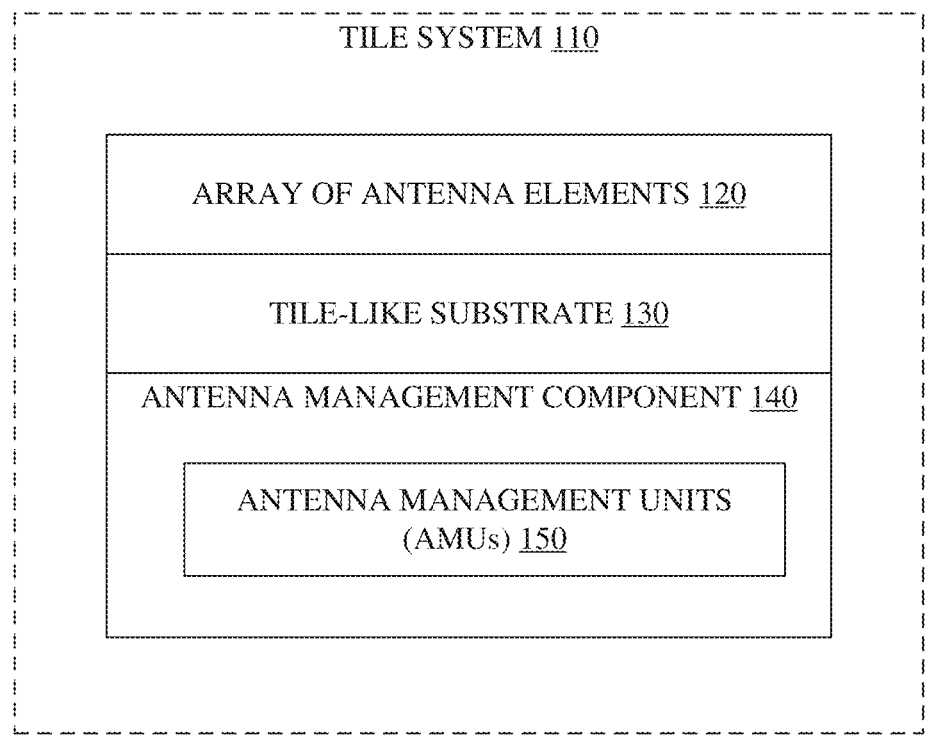
FIG. 1 illustrates a block diagram of a tile system that facilitates delivery of power to a power storage element of a wireless device, in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

Conventional wireless power transmission technologies have had some drawbacks with respect to using many antennas and microchips to wirelessly deliver power to a device. Various embodiments disclosed herein can effectively transfer power to wireless devices using TFT-based antenna management circuits and multiple adaptively phased antenna elements that have been deposited, formed, fabricated, etc. on surface(s) of a flat panel, e.g., tile-like, substrate.

For example, a method, e.g., of manufacture, can comprise depositing, onto a flat panel substrate, an antenna layer comprising multiple adaptively phased antennas elements; and depositing, onto the flat panel substrate, respective TFT-based antenna management circuits for the multiple adaptively phased antenna elements—the respective TFT-based antenna management circuits being operable to measure respective first phases at which first signals are received at the multiple adaptively phased antenna elements, and based on the respective first phases, e.g., based on a determination of respective complex conjugate phases of the respective first phases, control respective second phases at which second signals are transmitted from the multiple adaptively phased antenna elements to facilitate delivery, via the second signals, of power to a receiving device. Further, the method comprises forming traces communicatively coupling the multiple adaptively phased antenna elements to the respective TFT-based antenna management circuits.

In an embodiment, the depositing the antenna layer comprises depositing antenna element(s) of the multiple adaptively phased antenna elements on a first surface of the flat panel substrate opposing a second surface of the flat panel substrate on which one or more antenna management circuits of the respective TFT-based antenna management circuits are deposited.

In one embodiment, the method further comprises forming via(s) through the flat panel substrate to connect antenna element(s) of the multiple adaptively phased antenna elements to antenna management circuit(s) of the respective TFT-based antenna management circuits.

In other embodiment(s) (not shown), a mixed process can also be employed that uses TFT-based process(es) for manufacturing low-frequency digital/analog electronics, e.g., corresponding to the multiple adaptively phased antenna element(s) and/or the respective TFT-based antenna management circuits, and uses gallium arsenide (GaAs) semiconductor process(es) for manufacturing RF portions, e.g., of the multiple adaptively phased antenna element(s) and/or the respective TFT-based antenna management circuits, to enable finer features size, higher efficiency transistors, etc.

In another embodiment, an apparatus can comprise a flat panel substrate having deposited thereon: adaptively phased antennas elements; TFT-based antenna management circuits that respectively correspond to the adaptively phased antenna elements and respectively measure respective first phases of incoming signals received by the adaptively phased antennas elements and respectively control, based on the respective first phases (e.g., based on respective inverse phases of the respective first phases), respective second phases of outgoing signals transmitted by the adaptively phased antennas elements to deliver, via the outgoing signals, power to a receiving device; and traces respectively communicatively coupling the adaptively phased antennas elements to corresponding antenna management circuits of the TFT-based antenna management circuits.

In yet another embodiment, one or more antenna elements of the adaptively phased antenna elements are on a first surface that opposes a second surface on which one or more antenna management circuits of the TFT-based antenna management circuits are positioned.

In an embodiment, the apparatus further comprises one or more vias that are formed in the flat panel substrate to connect antenna element(s) of the adaptively phased antenna elements to antenna management circuit(s) of the TFT-based antenna management circuits.

In one embodiment, a system can comprise an array of antenna elements (e.g., comprising indium tin oxide (ITO), gold, silver, copper, aluminum, and/or titanium) that is positioned on a surface of a flat panel substrate, e.g., a tile-like flat panel substrate comprising one or more of, e.g., a ceramic material, a plastic material, a silicon material, a glass material, a flexible material of a defined flexibility, etc.; and an antenna management component that is positioned on the flat panel substrate and comprises, e.g., TFT circuits (e.g., comprising glass, sapphire, a ceramic material, a silicon material, and/or a flexible TFT circuit material having a defined flexibility) that respectively correspond to respective antenna elements of the array of antenna elements. In this regard, the antenna management component: receives, via the array of antenna elements, respective portions of a wireless signal (e.g., beacon) that has been transmitted by a wireless device; determines, based on characteristics of the respective portions of the wireless signal measured by the respective antenna elements, variants (e.g., phases, conjugate phases, complex conjugate phases, signals, etc.) of the respective portions corresponding to the respective antenna elements; and sends, via the respective antenna elements, the variants of the respective portions directed to the wireless device according to a defined transmission power to deliver power to the wireless device that charges a power storage element, e.g., rechargeable battery, of the wireless device.

In another embodiment, the variants of the respective portions comprise respective RF power waveforms and are sent by the respective antenna elements according to determinations of inverse, complex conjugate, etc. phases of respective phases of the respective portions of the wireless signal that has been transmitted by the wireless device.

In yet another embodiment, the array of antenna elements is on a first side of the tile-like flat panel substrate, and the TFT circuits are on a second side of the tile-like flat panel substrate that is opposite the first side.

In an embodiment, the antenna management component comprises an antenna control system comprising, e.g., a TFT circuit, an integrated circuit (IC) that has been bonded (e.g., via wafer level packaging (WLP) (e.g., flip-chip, chip-scale, etc.) to the TFT circuits, etc. In turn, the antenna control system can determine, via respective AMUs (e.g., which have been connected, by way of respective vias within the flat panel substrate, to respective antenna elements of the array of antenna elements), the variants (e.g., phases, conjugate phases, complex conjugate phases, signals, etc.) of the respective portions.

In another embodiment, the respective vias are shielded from each other to facilitate a reduction of electromagnetic interference comprising, e.g., a surface standing wave corresponding to the flat panel substrate, a guide standing wave corresponding to the flat panel substrate, etc.

In yet another embodiment, an AMU of the AMUs comprises: an interface (e.g., transceiver) that receives, via an antenna element of the array of antenna elements, a portion of the respective portions of the wireless signal; a phase detector that determines a phase of the portion and an amplitude of the portion; and a phase shifter that generates a modified phase based on the phase, e.g., the modified phase determined to be an inverse of the phase. In turn, a variant of the variants (e.g., comprising a phase, a conjugate phase, a complex conjugate phase, a signal, etc.) that has been generated using the modified phase is sent to the wireless device via the antenna element, e.g., in a direction that the portion of the respective portions of the wireless signal was received. In this regard, respective antenna elements of the array of antenna elements can direct respective phases, conjugate phases, complex conjugate phases, signals, etc., which have been generated via respective AMUs based on the respective portions of the wireless signal that have been received by the respective antenna elements, back to the wireless device.

In an embodiment, the system further comprises an AMB comprising the array of antenna elements, the antenna management component, and connectors that are arranged at a periphery of the AMB to facilitate a mechanical connection to another AMB.

In one embodiment, the system further comprises a group of AMBs comprising the AMB; and a controller PCB comprising an antenna control system that is configured to facilitate control of the AMU with respect to a reception of the portion of the respective portions of the wireless signal, a determination of the phase of the portion and the amplitude of the portion, a generation of the modified phase, and a transmission of the variant (e.g., phase, conjugate phase, complex conjugate phase, signal, etc.) of the variants of the respective portions directed to the wireless device.

In another embodiment, the antenna control system comprises a sensor component that emits, via the array of antenna elements, respective wireless beacons; determines respective amplitudes of wireless signals, corresponding to the respective wireless beacons, which have been received at respective antenna elements of the array of antenna elements; determines respective phases of the wireless signals; and generates, based on the respective amplitudes and the respective phases, an image of an object and/or an environment corresponding to the antenna control system.

In yet another embodiment, the sensor component can generate the image of the object and/or the environment based on the characteristics of the respective portions of the wireless signal measured by the respective antenna elements of the array of antenna elements.

In yet another embodiment, a method, e.g., to facilitate delivering of power to a power storage element (e.g., a rechargeable battery) of a wireless device, comprises: receiving, by a system comprising a processor via an array of antenna elements that has been formed on a flat panel substrate (e.g., comprising one or more of a ceramic material, a plastic material, a silicon material, a glass material, a flexible material of a defined flexibility, etc.), respective portions of a wireless beacon from the wireless device; determining, by the system, complex conjugate phases of phases at which respective antenna elements of the array of antenna elements have received the respective portions of the wireless beacon; and sending, transmitting, etc., by the system via the respective antenna elements based on the complex conjugate phases, RF power waveforms directed to the wireless device to facilitate the delivery of power to the power storage element of the wireless device.

In an embodiment, the system comprises thin film transistors (TFTs) that facilitate the determining of the complex conjugate phases. In one embodiment, the array of antenna elements has been formed on a first side of the flat panel substrate, and the TFTs are formed on a second side of the flat panel substrate that is opposite the first side.

In one embodiment, an apparatus (e.g., embodied in a tile that is attachable to, or mountable within, a ceiling, a wall, a floor, an object, etc.) can comprise: an antenna layer comprising a first array of adaptively phased antenna elements on a first side of a flat panel substrate; a control circuit comprising antenna management units corresponding to respective antenna elements of the adaptively phased antenna elements on a second side of the flat panel substrate that is opposite the first side; and traces communicatively coupling the antenna management units to the respective antenna elements.

Reference throughout this specification to "one embodiment," "an embodiment," etc. means that a particular feature, structure, or characteristic described in connection with the embodiment is included in at least one embodiment. Thus, the appearances of the phrase "in one embodiment," "in an embodiment," etc. in various places throughout this specification are not necessarily all referring to the same embodiment. Furthermore, the particular features, structures, or characteristics may be combined in any suitable manner in one or more embodiments.

As mentioned above, conventional wireless power transmission systems have had some drawbacks with respect to delivering power via RF means. For example, although a directed antenna system can increase delivered power over a specific transmitter area by increasing an operational frequency of the directed antenna system, such system results in an increase in a number of antennas and corresponding management circuits used to deliver power. In turn, with the increase in operational frequency, separation between antennas of the antenna array decreases, which reduces an available bonding area in the antenna array to secure integrated circuits to control the antennas, and increases RF noise coupling issues between the integrated circuits.

To address these and other concerns of conventional wireless power transmission technologies, various embodiments disclosed herein can transfer power to a wireless device using TFT-based antenna management circuits and multiple adaptively phased antenna elements that have been deposited, formed, fabricated, etc. on surface(s) of a flat panel, e.g., tile-like, substrate.

In this regard, and now referring to FIGS. 1-3, a block diagram of a tile system (110) that facilitates delivery of power to a power storage element of a wireless device (e.g., 510, wireless devices 1602 (see below), etc.), a sample mechanical drawing of a tile-like substrate (130) comprising an array of antenna elements (120) and an antenna management component (140) comprising AMUs (150), and a block diagram of an antenna management component (140) comprising an antenna control system (310) that is communicatively coupled to an AMU (220) of the AMUs to facilitate the delivery of power to the storage element of the wireless device are illustrated, respectively, in accordance with various example embodiments.

A tile system (110) comprises an array of antenna elements (120) that is positioned on a surface of a flat panel substrate, e.g., a tile-like substrate (130), e.g., a tile-like flat panel substrate, e.g., comprising one or more of, e.g., a ceramic material, a plastic material, a silicon material, a glass material, a flexible material of a defined flexibility, etc. In embodiment(s), references to terms such as "flat panel", "flat panel display", "flat panel substrate" or "flat panel technology" can comprise, but not be limited to comprising, a curved panel, a curved panel display, a curved panel substrate, and/or a curved panel technology. In other embodiment(s), an antenna element (210) of array of antenna elements (120) can comprise a highly conductive material, metal deposit, ITO, thick ITO, gold, silver, copper, aluminum, and/or titanium.

Further, the tile system (110) comprises an antenna management component (140) that is positioned on the flat panel substrate and comprises AMUs (150). In embodiment(s) illustrated by FIG. 2, an AMU (220) of the AMUs (150) is positioned on a surface opposite the surface comprising the array of antenna elements (120). In other embodiment(s) (not shown), the AMU (220) can be positioned on the same surface that the array of antenna elements (120) is positioned on.

In embodiment(s), the AMU (220) comprises a TFT circuit (e.g., comprising glass, sapphire, a ceramic material, and/or a flexible TFT circuit material having a defined flexibility). In other embodiment(s), the TFT circuit can be deposited and/or embedded onto the flat panel substrate, e.g., comprising a silicon nanomembrane (SiNM), via process(es) like those utilized in the manufacture of a flat screen television, a liquid-crystal display (LCD), a light-emitting diode (LED), an organic LED (OLED), similar display technologies, etc., e.g., such process(es) comprising etching, embedding, depositing, doping, etc. of materials. In this regard, the TFT circuit can comprise a phase lock loop (PLL), a power amplifier, a low noise amplifier, similar complex circuit device(s), etc.

In other embodiment(s), the flat panel substrate is approximately 1 mm thick, e.g., suitable for efficient operation in industrial, scientific and medical (ISM) radio band(s) that have been reserved for use in RF energy applications. In other embodiment(s) (not shown), metal, a layer of metal, e.g., silver, gold, etc. can be deposited on portion(s) of the TFT circuit, TFT circuit layers, etc., e.g., to increase operational efficiency of the TFT circuit, to reduce heat generated by the TFT circuit, etc.

Figure 2:
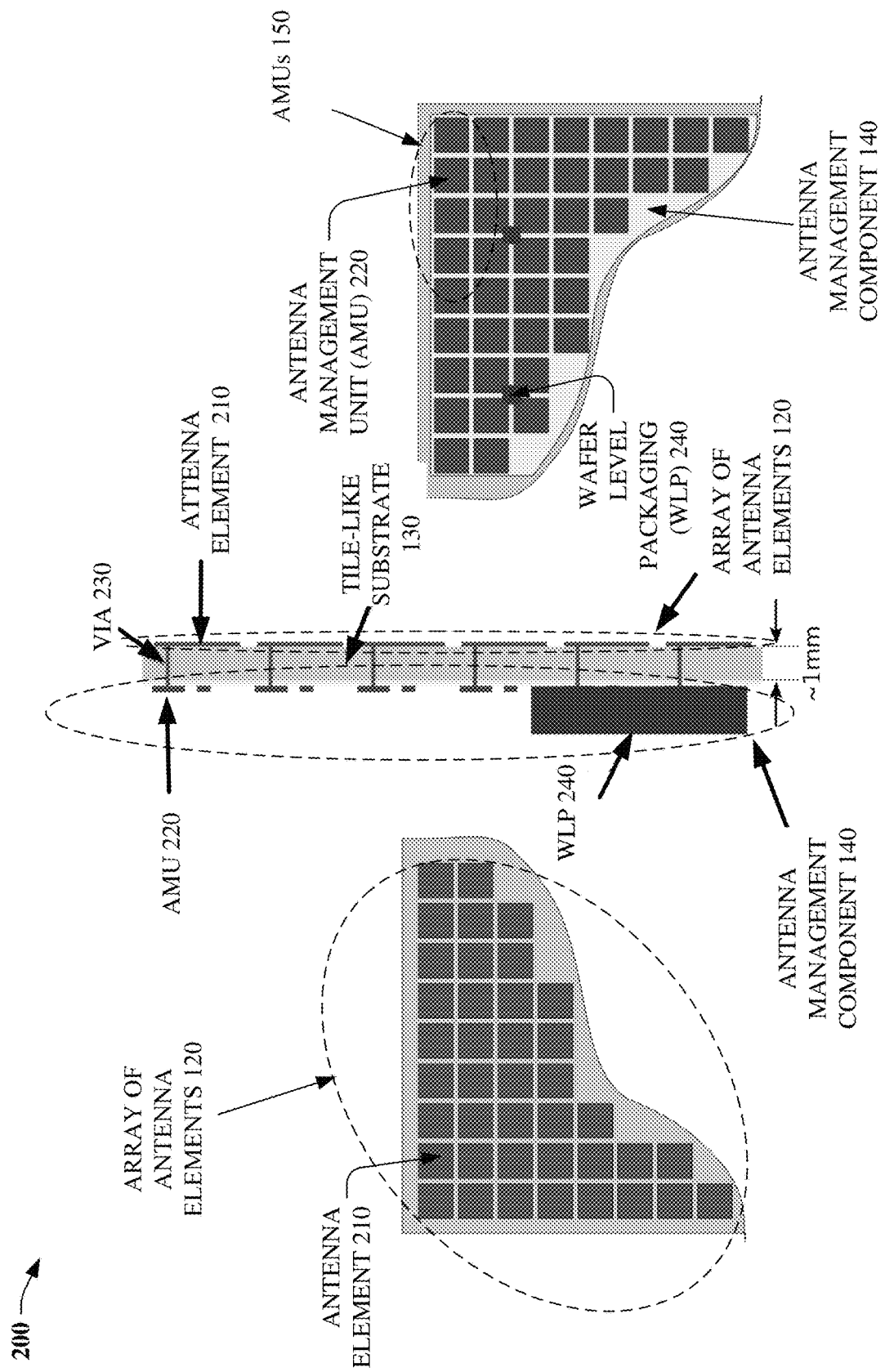
FIG. 2 illustrates a sample mechanical drawing of a tile-like substrate comprising an array of antenna elements and antenna management units (AMUS) that are positioned on surfaces of the tile-like substrate, in accordance with various example embodiments.
Figure 3:
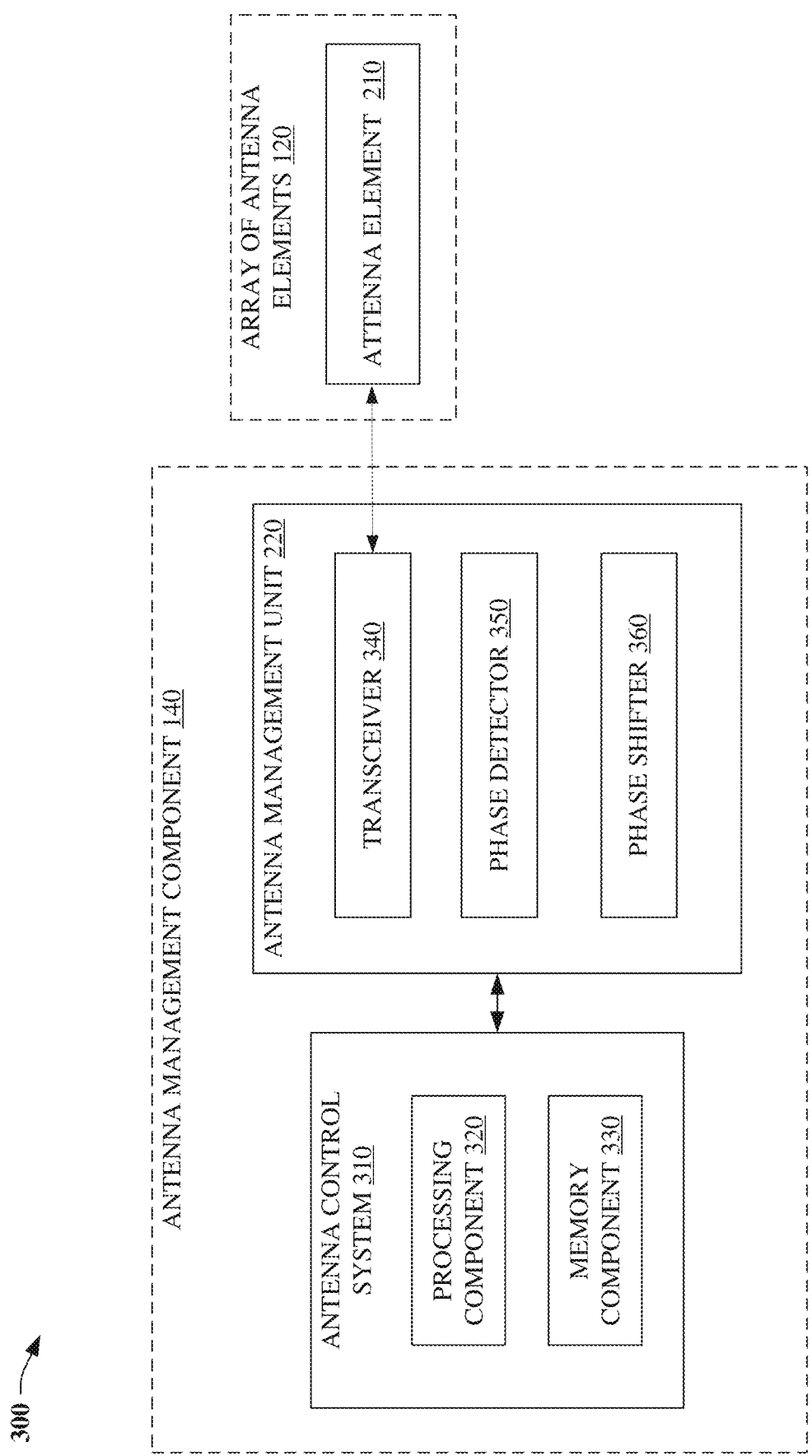
FIG. 3 illustrates a block diagram of an antenna management component comprising an antenna control system that is communicatively coupled to an antenna management unit (AMU) to facilitate wireless delivery of power to a receiving device, in accordance with various example embodiments.

As illustrated by FIG. 2, in embodiment(s), each AMU (e.g., 220) of AMUs (150) is connected, by way of respective vias (e.g., 230) within the flat panel substrate, to respective antenna elements (e.g., 210) of the array of antenna elements (120). In other embodiment(s) (not shown), the respective vias are shielded from each other, e.g., using additional material(s), to facilitate a reduction in electromagnetic coupling between components, device(s), etc.; to facilitate a reduction of a surface standing wave condition in the flat panel substrate; and/or to facilitate a reduction of a guide standing wave condition in the flat panel substrate, etc. It should be appreciated that in other embodiment(s) (not shown), one or more AMUs can be connected to an antenna element. In yet other embodiment(s), traces, e.g., conductive traces, etc. formed on the flat panel substrate can communicatively couple one or more AMUs to one or more antenna elements.

Now referring to FIGS. 3 and 5, each AMU (e.g., 220) of AMUs (150) can receive, utilizing respective transceivers (e.g., 340) via respective antenna elements (e.g., 210) of the array of antenna elements (120), respective portions of a wireless signal (e.g., wireless beacon 505) that has been transmitted by a wireless device (e.g., 510, wireless devices 1602 (see below), etc.). In this regard, AMUs of respective tile systems (110)—located on a floor, a wall, a ceiling, and/or an object, e.g., furniture, appliance, light fixture, etc. (not shown) of room (500)—can receive, via the respective transceivers via the respective antenna elements, the respective portions of the wireless signal. It should be appreciated that although FIGS. 5-8 illustrate the tile systems (110) being located on a floor, a wall, and a ceiling of a room, building, etc., in other embodiment(s) (not shown), the tile systems (110) can be located on any combination of floor, wall, ceiling, and/or object, e.g., located only on the ceiling; located only on the wall; located only on the floor; located only on the ceiling and the wall; located only on the floor and the wall; located only on the ceiling and the floor; located only on an object; located only on the object and the ceiling, etc.

Figure 4:
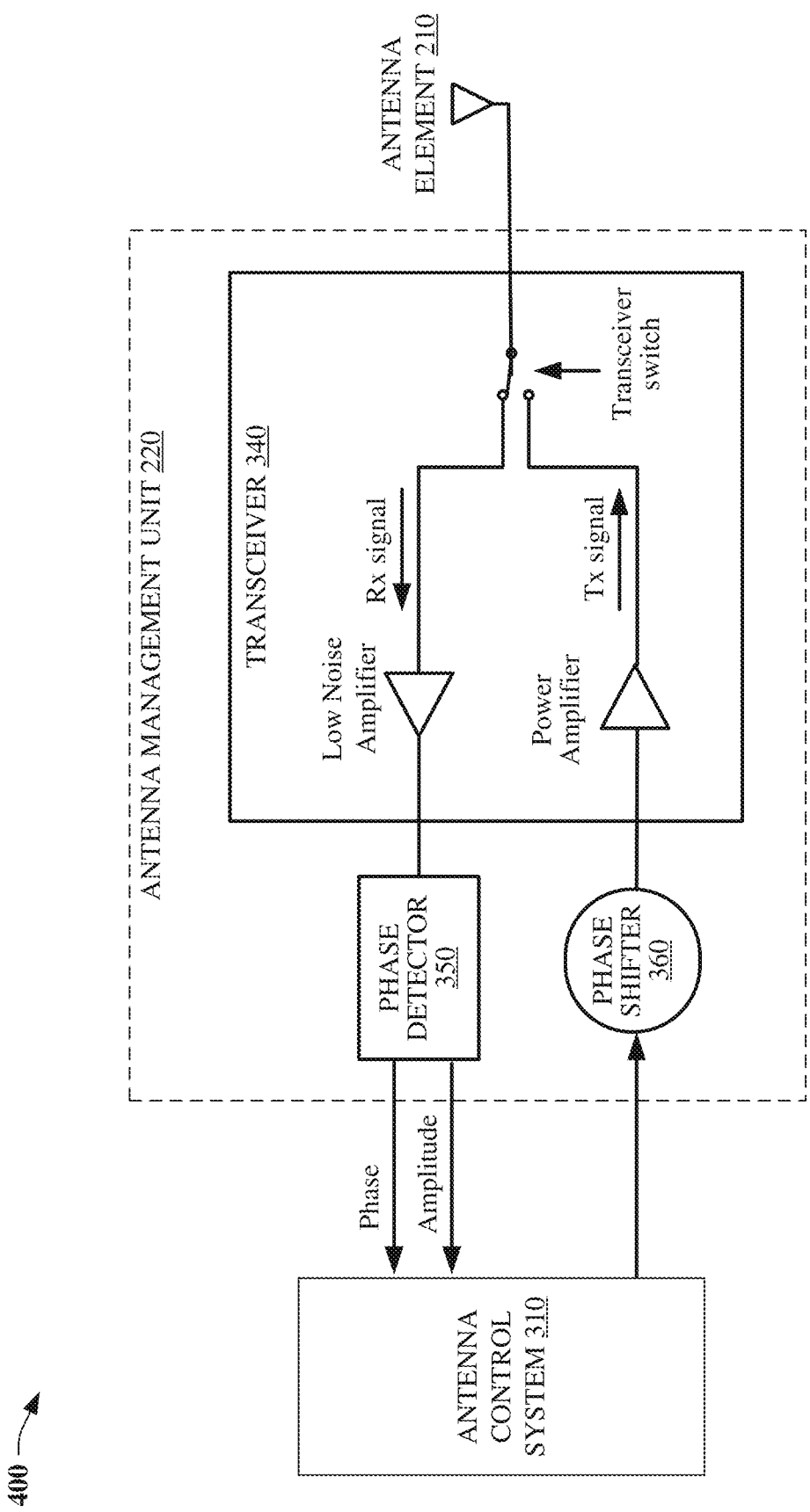
FIG. 4 illustrates a block diagram of an AMU comprising a transceiver, a phase detector, and a phase shifter, in accordance with various example embodiments.

As illustrated by FIG. 4, a low noise amplifier of a transceiver of the respective transceivers corresponding to an AMU can receive a portion of the respective portions of the wireless signal. Further, a phase detector (e.g., 350) of the AMU can determine a phase of the portion and an amplitude of the portion. In turn, an antenna control system (e.g., 310) can determine a variant of the portion based on the determined phase and the determined amplitude of the portion, e.g., the variant comprising an inverted phase, a conjugate phase, a complex conjugate phase, etc. of the determined phase.

Figure 5:
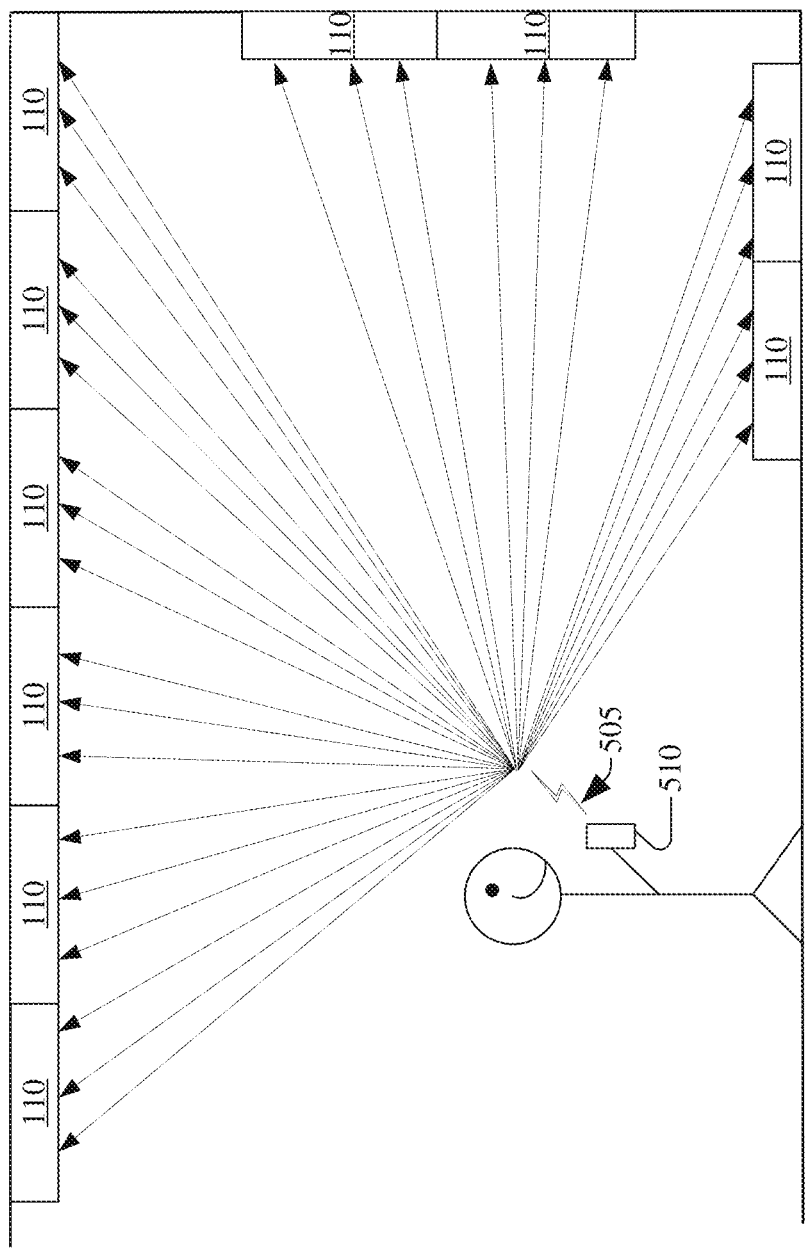
FIG. 5 illustrates a beacon being transmitted by a wireless device and portions of the beacon being received via respective antenna elements that have been formed on flat panel substrates of respective tile systems, in accordance with various example embodiments.

In this regard, and now referring to FIG. 5, each phase detector (e.g., 350) of AMUs (150) can determine phases of the respective portions and amplitudes of the respective portions. In turn, an antenna control system (310) can determine, based on the phases and the amplitudes, variants of the respective portions. For example, in embodiment(s), the antenna control system (310) can determine, via processing component (320) and memory component (330), that the variants of the respective portions are inverted phases, complex conjugate phases, etc. of the respective portions, and can generate, via respective phase shifters (e.g., 360), the variants of the respective portions.

Figure 6:
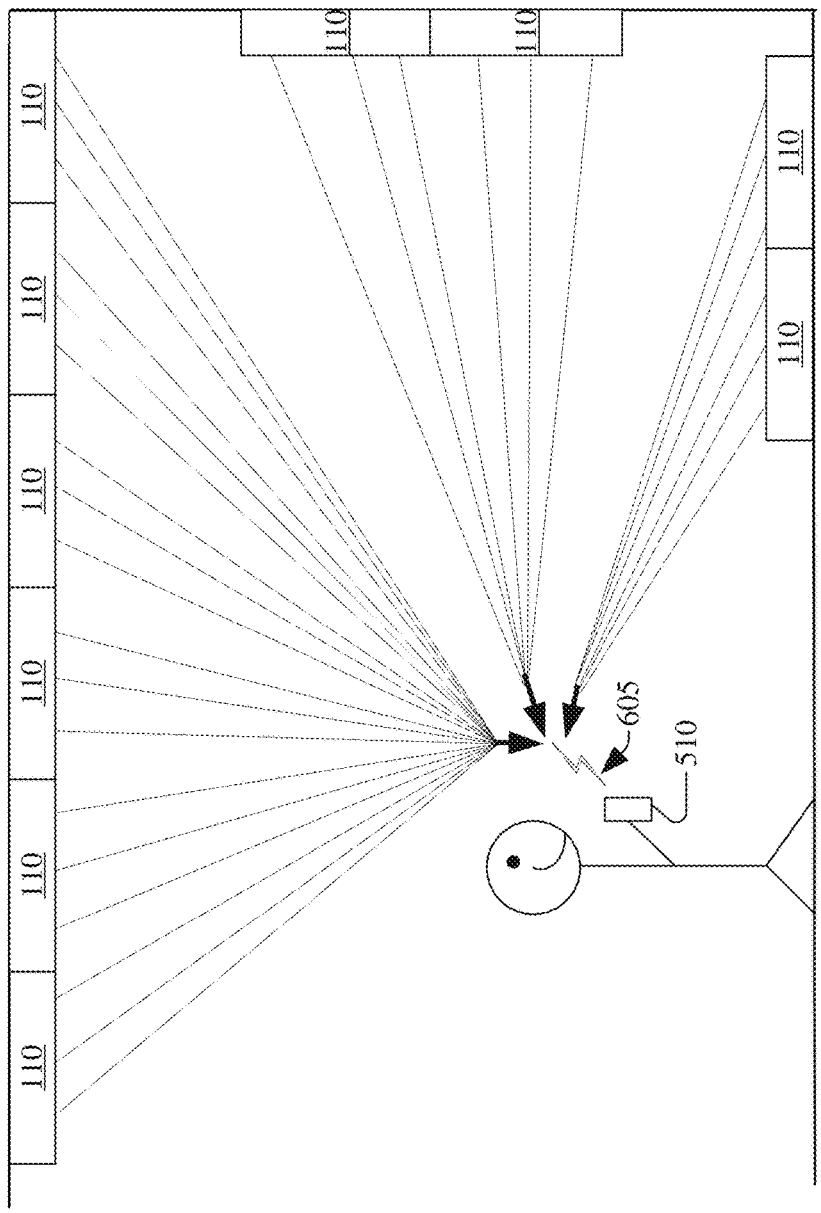
FIG. 6 illustrates RF power waveforms being transmitted, along paths of portions of a beacon that were received by respective antenna elements that have been formed on flat panel substrates of respective tile systems, to a wireless device to facilitate delivery of power to a power storage element of the wireless device, in accordance with various example embodiments.

In turn, as illustrated, by FIG. 6, each AMU (e.g., 220) of AMUs (150) can (e.g., concurrently, substantially concurrently, e.g., within a defined amount of time) send, transmit, etc., utilizing the respective transceivers (e.g., 340) via the respective antenna elements (e.g., 210) according to a defined transmission power, e.g., in determined directions, paths, etc. that the respective portions of the wireless signal were received from the wireless device, the variants (e.g., phases, conjugate phases, complex conjugate phases, signals, etc.) (e.g., 605) of the respective portions, e.g., comprising RF power waveforms, to the wireless device, e.g., to deliver power to the wireless device that charges a power storage element (not shown) of the wireless device.

Figure 7:
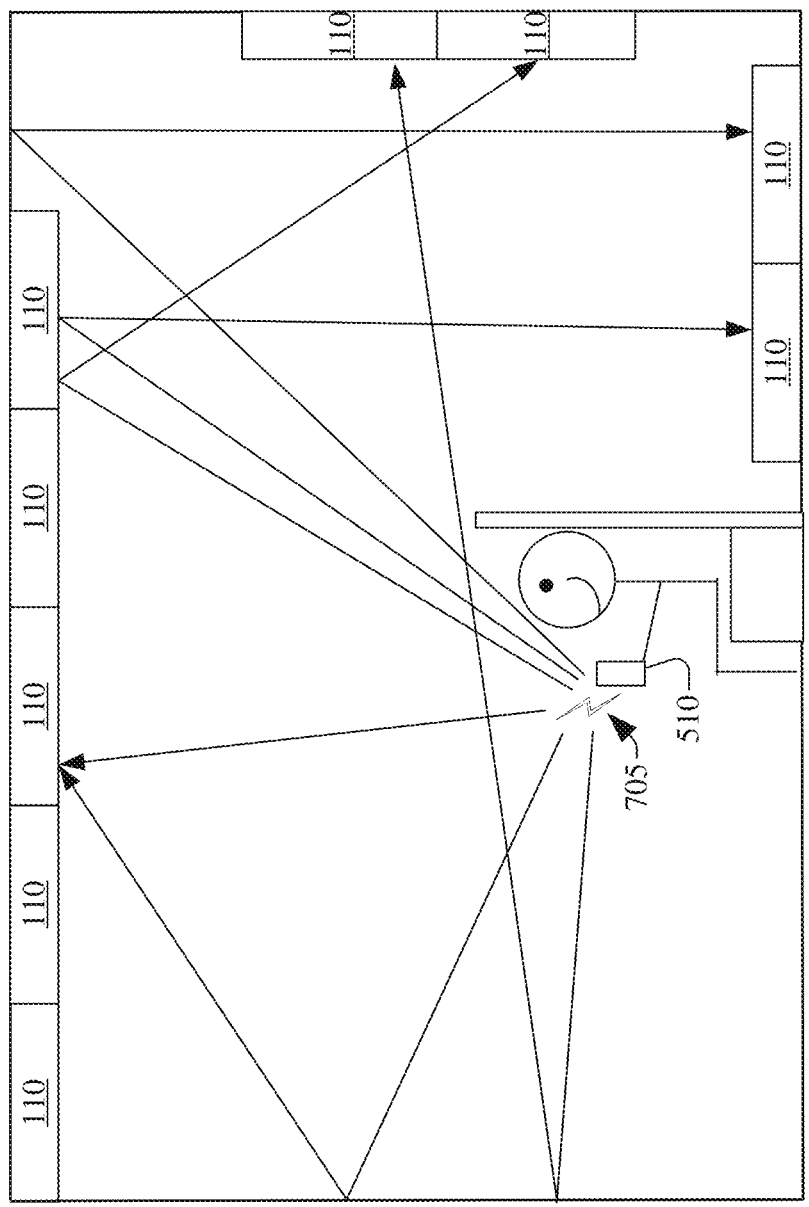
FIG. 7 illustrates a beacon being transmitted by a wireless device and reflections of the beacon being received via respective antenna elements that have been formed on flat panel substrates of respective tile systems, in accordance with various example embodiments.

As illustrated by FIG. 7, in various embodiment(s), each AMU (e.g., 220) of AMUs (150) can receive, utilizing respective transceivers (e.g., 340) via respective antenna elements (e.g., 210) of the array of antenna elements (120), reflections of the wireless signal (e.g., wireless beacon 705) that has been transmitted by the wireless device. Further, each phase detector (e.g., 350) of AMUs (150) can determine phases of the reflections and amplitudes of the reflections. In turn, the antenna control system (310) can determine, based on the phases and the amplitudes, variants of the reflections, e.g., comprising inverted phases, complex conjugate phases, etc. of the reflections.

Figure 8:
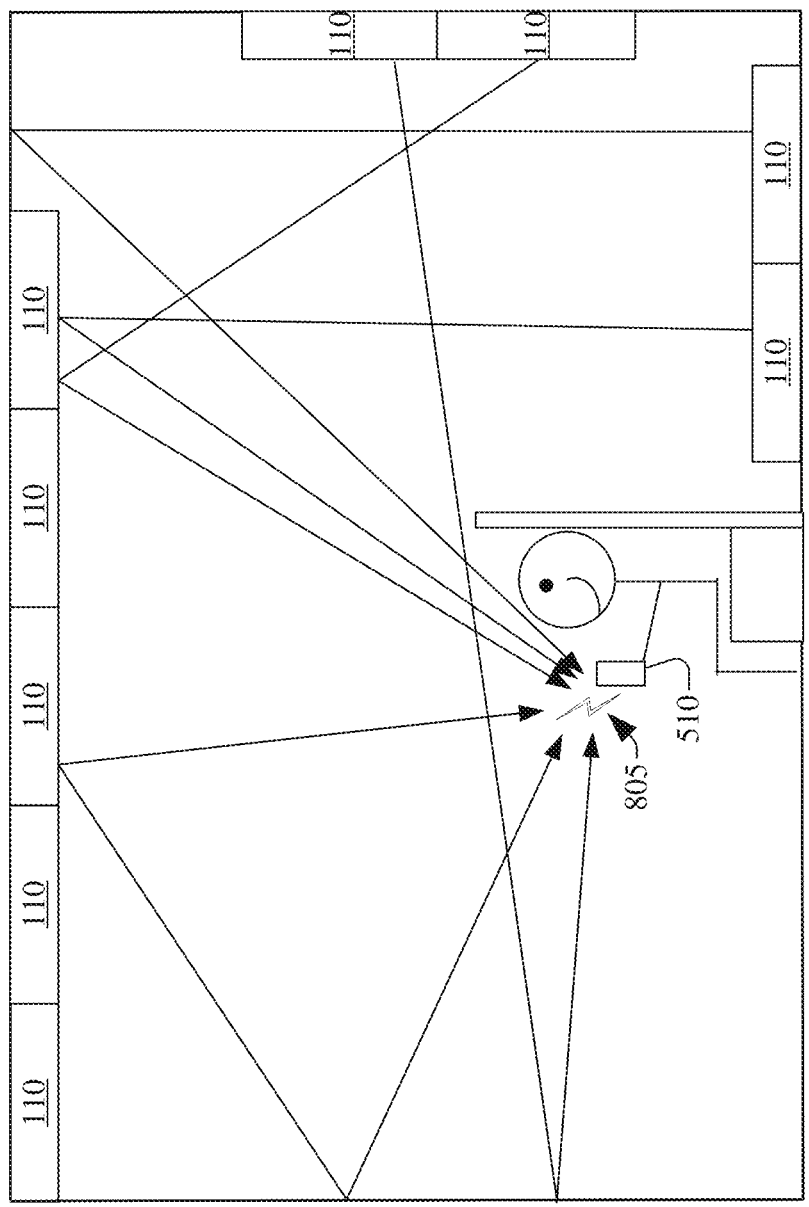
FIG. 8 illustrates RF power waveforms being transmitted, along paths of reflections of a beacon that were received by respective antenna elements that have been formed on flat panel substrates of respective tile systems, to a wireless device to facilitate delivery of power to a power storage element of the wireless device, in accordance with various example embodiments.

In turn, as illustrated, by FIG. 8, each AMU (e.g., 220) of AMUs (150) can (e.g., concurrently, substantially concurrently, e.g., within a defined amount of time) send, transmit, etc., utilizing the respective transceivers (e.g., 340) via the respective antenna elements (e.g., 210) according to a defined transmission power, e.g., in determined directions, paths, etc. that the reflections of the wireless signal were received from the wireless device the variants (e.g., 805) of the reflections, e.g., comprising RF power waveforms, to the wireless device, e.g., to deliver power to the wireless device that charges a power storage element (not shown) of the wireless device.

It should be appreciated in that in various embodiment(s), wafer level packaging (WLP) (e.g., flip-chip, chip-scale, etc.) (e.g., 240) can be bonded onto the flat panel substrate and connected to one or more AMUS (150), e.g., to increase computational capacity, reduce circuit constraints, etc. In this regard, the WLP can comprise one or more components, portions, etc. of antenna management component (140).

Figure 9:
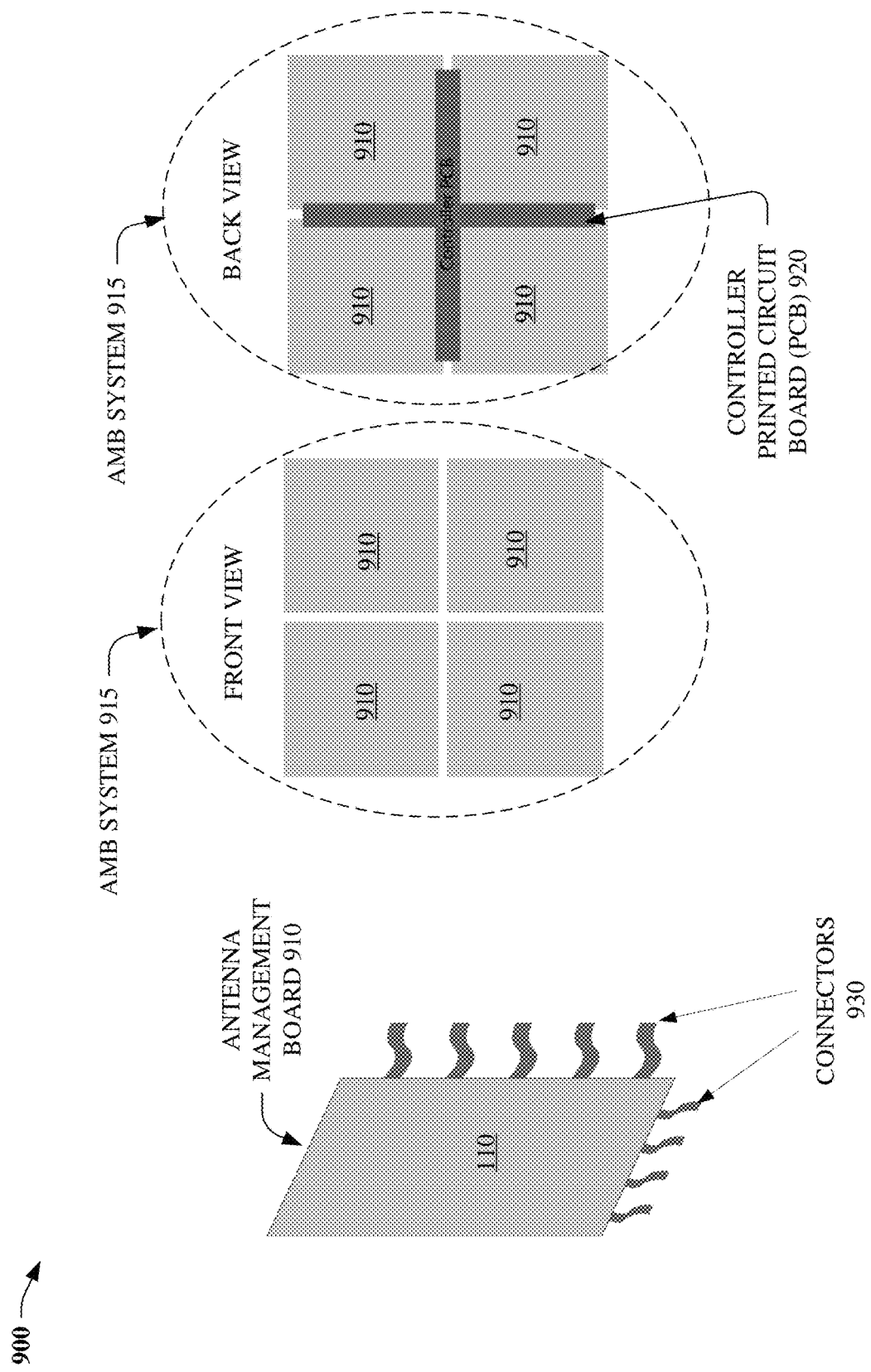
FIG. 9 illustrates a block diagram of an antenna management board (AMB) system comprising a group of antenna management boards (AMBs), in accordance with various example embodiments.
Figure 10:
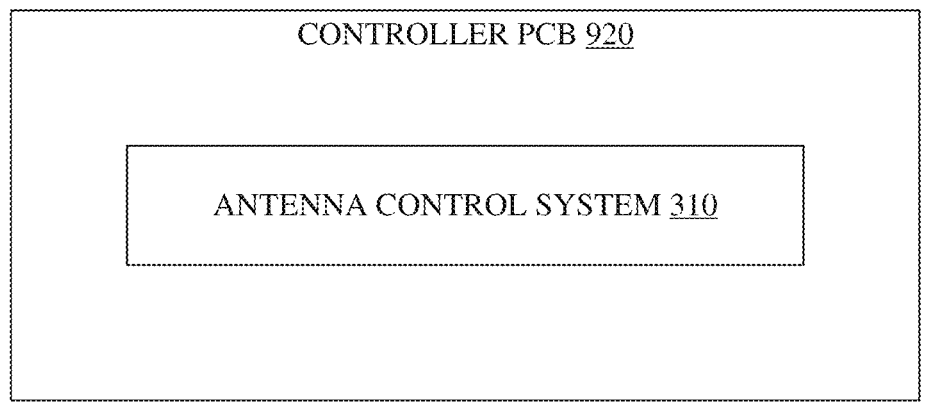
FIG. 10 illustrates a block diagram of a controller printed circuit board (PCB) comprising an antenna control system to wirelessly deliver, via an AMB system, power to a wireless device that charges a power storage element of the wireless device, in accordance with various example embodiments.

Now referring to FIGS. 9-10, a block diagram of an AMB system (915) comprising a group of AMBs, and a block diagram of a controller PCB (920) comprising an antenna control system (310) to wirelessly deliver, via the AMB system, power to a wireless device are illustrated, respectively, in accordance with various example embodiments.

As illustrated by FIG. 9, an AMB (910) comprises the tile system (110) and connectors (930) that are arranged at a periphery of the AMB (910) to facilitate a mechanical and/or electrical connection to another AMB. In this regard, an AMB system (915) can comprise the group of AMBs, e.g., which are physically and/or electrically connected to each other by way of respective connectors (e.g., 930). Further, the AMB system (915) can comprise a controller PCB (920), e.g., positioned between AMB(s) of the group of AMBs, which comprises antenna control system (310), e.g., to facilitate wirelessly delivery, via the AMB system (915), of power to a receiving device.

Figure 11:
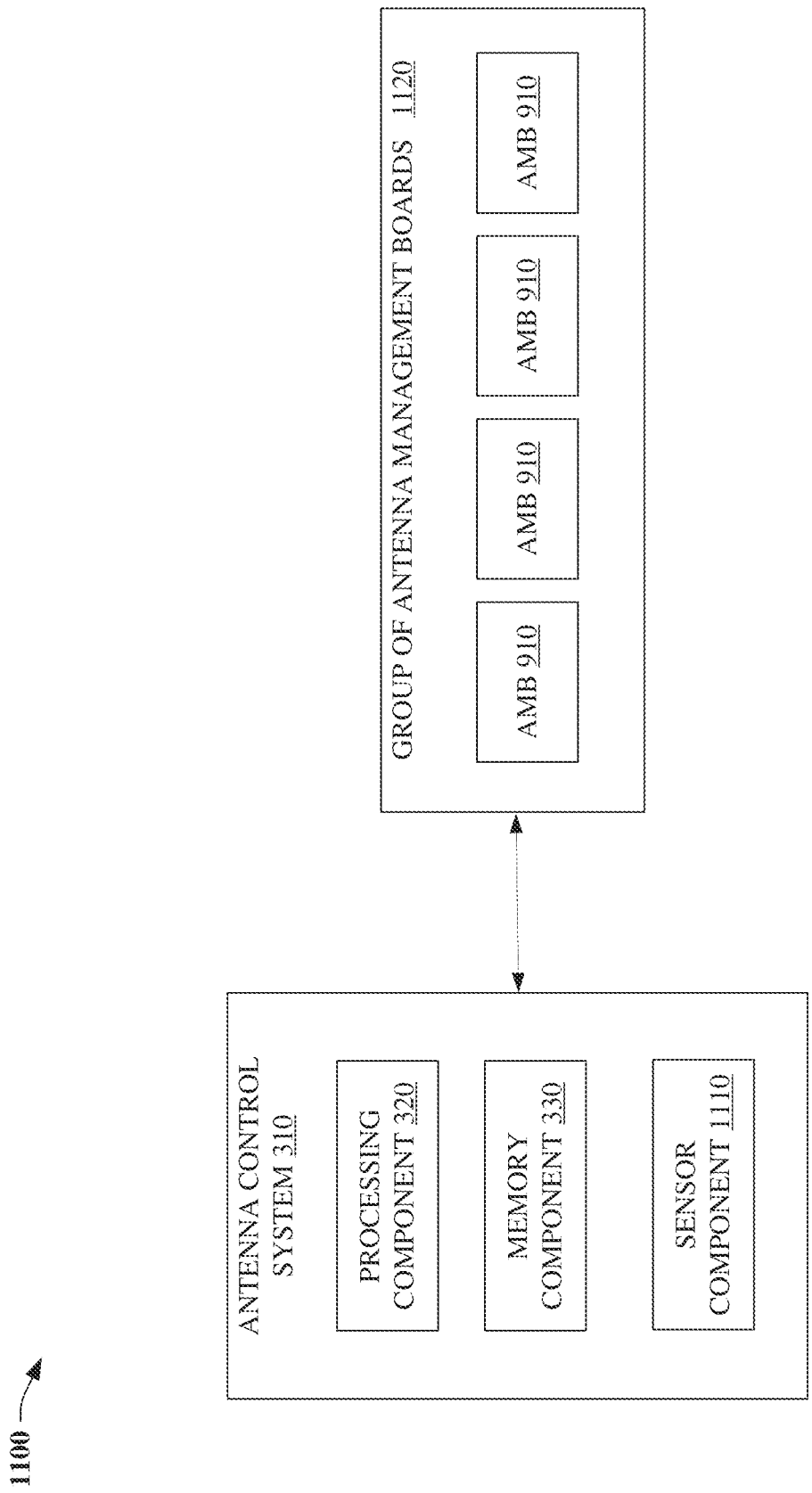
FIG. 11 illustrates a block diagram of an AMB system comprising a sensor component that generates, via antenna elements of the AMB system, an image of an object, in accordance with various example embodiments.

In other embodiment(s), as illustrated by FIG. 11, an antenna control system (310) can comprise a sensor component (1110) that can emit, via AMBs of a group of AMBs (1120), respective wireless beacons; determine respective amplitudes of wireless signals, corresponding to the respective wireless beacons, which have been received at respective antenna elements of the group of AMBs (1120); determine respective phases of the wireless signals; and generate, based on the respective amplitudes and the respective phases, an image of an object and/or an environment of the antenna control system (310).

In yet other embodiment(s), the sensor component (1110) can generate the image of the object and/or the environment based on characteristics of respective portions of a wireless signal (e.g., beacon that has been transmitted by a wireless device) that have been measured by respective antenna elements of the group of AMBs (1120).

In yet other embodiment(s), e.g., in the context of scanning applications, some of the antenna elements of the group of AMBs (1120) can be used to emit a signal, e.g., as a scanning signal, e.g., enabling full imagery based on determined phases and amplitudes of returned signals, e.g., based on reflection(s) of the scanning signal, e.g., the determined phases and amplitude comprising an RF hologram of an environment comprising the group of AMBs It should be appreciated that in various embodiment(s) disclosed herein, one or more components of an AMU can be omitted, or additional components can be included in the AMU. For example, a fixed beam transmission system (not shown) can comprise an AMU comprising a simplified transmit chain block, e.g., without circuits, components, devices corresponding to receive functionality, e.g., without comprising a transceiver switch, a low noise amplifier, a phase detector, etc., e.g., since a fixed beam system would not require any receive functionality to detect wireless signal(s), reflection(s), etc. In this regard, in embodiment(s), the simplified transmit block chain can comprise up-conversion and/or down-conversion circuitry comprising, e.g., an RF source, a power amplifier, RF distribution circuitry, and a fixed phase shifter for each antenna of the fixed beam transmission system.

Further, while portions of the subject disclosure are directed to examples for improved wireless power transfer, it should be appreciated that embodiments disclosed herein are applicable to, e.g., data communication application(s), image recognition application(s), radar application(s), Internet of things applications, various RF sensing and/or RF scanning applications comprising, but not being limited to, autonomous vehicle application(s), facial recognition application(s), fingerprint sensor application(s), etc.

For example, directed antenna systems made possible via embodiment(s) disclosed herein can result in tile-like substrates comprising embedded sensors, e.g., by emitting a beacon and measuring, at an array of the embedded sensors, phases across the array that result, by generating an image of an object and/or an environment corresponding to the embedded sensors—the embedded sensors determining the image based on characteristic of respective portions of a wireless signal measured by respective antenna elements of the embedded sensors, etc.

In another example, embedded sensors in a tile-like substrate of a flat panel can be used for scanning environments, e.g., using sensors on lights and/or windows of a vehicle to enable autonomous travel, etc. In yet another example, the embedded sensors can be used for security applications, e.g., to scan through clothing, costumes, masks, etc.; to replace moving security airport scanners, e.g., which require travelers to stand still while many images are taken and stitched, compiled, etc. together, with a human sized scanner that is capable of instantaneously taking a single image of the traveler.

It should be appreciated that regardless of an application, directed antenna systems made possible via embodiment(s) disclosed herein can be integrated into existing devices, e.g., television(s), decorative glass, display(s), a car windshield, glass, etc.

FIGS. 12-15 illustrate methodologies in accordance with the disclosed subject matter. For simplicity of explanation, the methodologies are depicted and described as a series of acts. It is to be understood and appreciated that various embodiments disclosed herein are not limited by the acts illustrated and/or by the order of acts. For example, acts can occur in various orders and/or concurrently, and with other acts not presented or described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events.

Additionally, it should be further appreciated that the methodologies disclosed hereinafter corresponding to an antenna control system (e.g., 310) are capable of being stored on an article of manufacture to facilitate transporting and transferring such methodologies to computing device(s). The term article of manufacture, as used herein, is intended to encompass a computer program accessible from any memory device, computer-readable device, carrier, or media, e.g., a non-transitory computer readable medium, etc.

Figure 12:
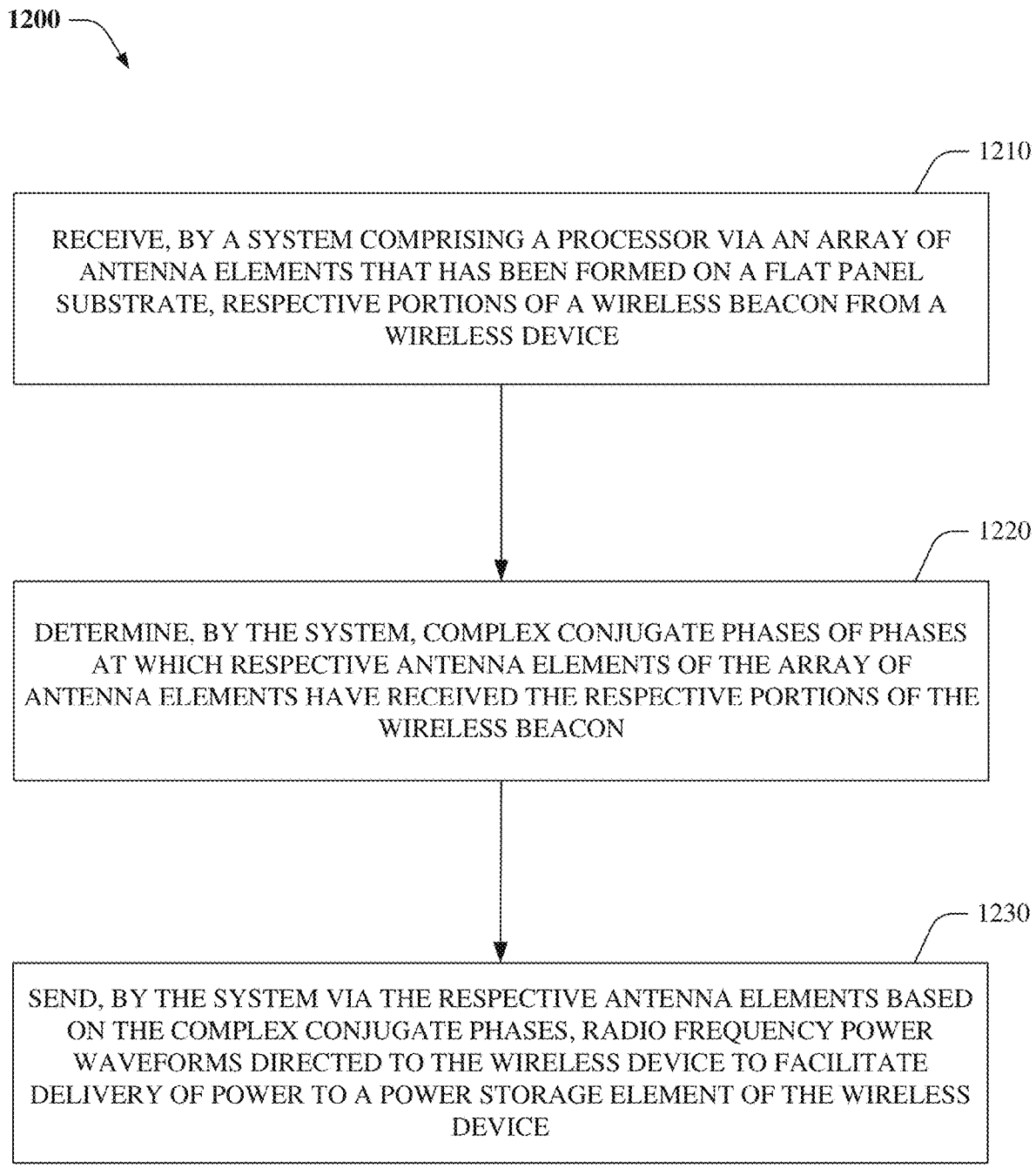
FIG. 12 illustrates a flow chart of a method for facilitating, via an array of antenna elements that has been formed on a flat panel substrate, delivery of power to a power storage element of a wireless device, in accordance with various example embodiments.

Referring now to FIG. 12, a flow chart of a method, e.g., performed by a system (e.g., antenna control system 310), for facilitating, via an array of antenna elements that has been formed on a flat panel substrate, delivery of power to a power storage element of a wireless device is illustrated, in accordance with various example embodiments. At 1210, the system can receive, via the array of antenna elements that has been formed on the flat panel substrate, respective portions of a wireless beacon from the wireless device. At 1220, the system can determine complex conjugate phases of phases at which respective antenna elements of the array of antenna elements have received the respective portions of the wireless beacon. At 1230, the system can send, transmit, etc., via the respective antenna elements based on the complex conjugate phases, RF power waveforms directed to the wireless device to facilitate the delivery of power to the power storage element of the wireless device.

Figure 13:
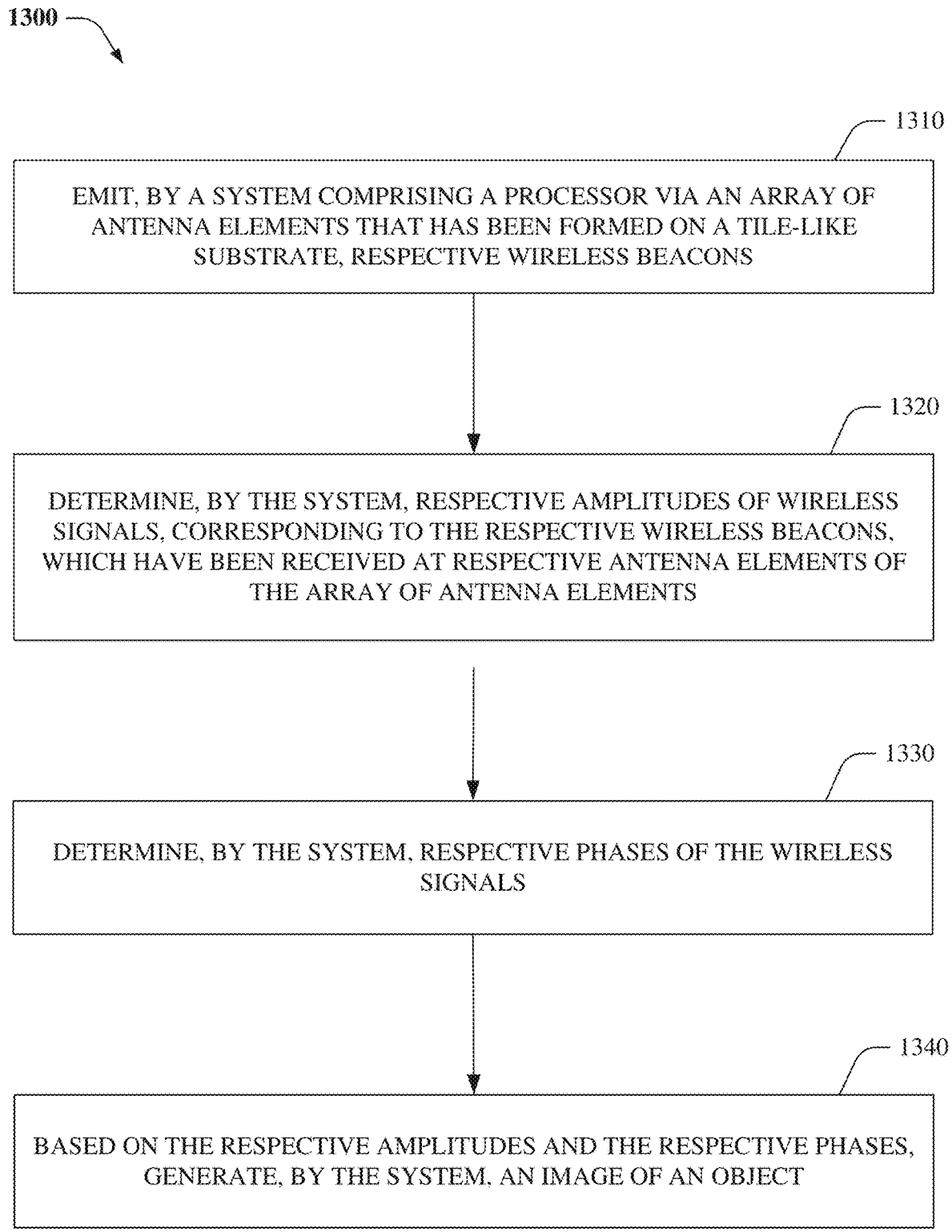
FIG. 13 illustrates a flow chart of a method for facilitating, via an array of antenna elements that has been formed on a flat panel substrate, generation of an image of an object and/or an environment corresponding to the array of antenna elements, in accordance with various example embodiments.

FIG. 13 illustrates a flow chart of a method, e.g., performed by a system (e.g., antenna control system 310), for facilitating, via an array of antenna elements that has been formed on a flat panel substrate, generation of an image of an object and/or environment of the system, in accordance with various example embodiments. At 1310, the system can emit, via an array of antenna elements that has been formed on a tile-like substrate, respective wireless beacons. At 1320, the system can determine respective amplitudes of wireless signals, corresponding to the respective wireless beacons, which have been received at respective antenna elements of the array of antenna elements. At 1330, the system can determine respective phases of the wireless signals. At 1340, the system can generate, based on the respective amplitudes and the respective phases, an image of an object.

Figure 14:
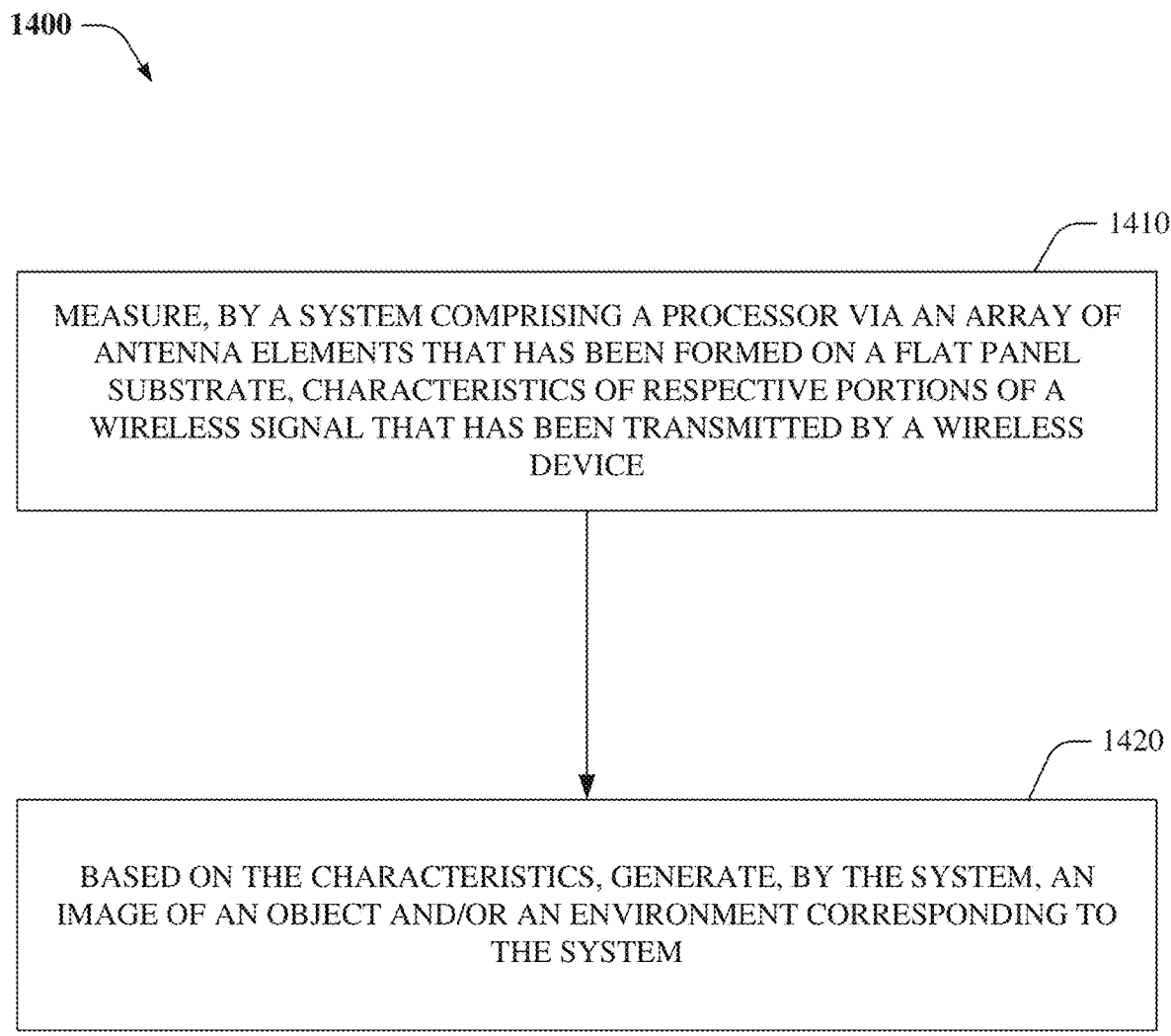
FIG. 14 illustrates a flow chart of another method for facilitating, via the array of antenna elements that has been formed on the flat panel substrate, the generation of the image of the object and/or the environment corresponding to the array of antenna elements, in accordance with various embodiments.

FIG. 14 illustrates a flow chart of another method, e.g., performed by a system (e.g., antenna control system 310), for facilitating, via an array of antenna elements that has been formed on a flat panel substrate, generation of an image of an object and/or an environment of the system, in accordance with various example embodiments. At 1410, the system can measure, via an array of antenna elements that has been formed on a flat panel substrate, characteristics of respective portions of a wireless signal that has been transmitted by a wireless device. At 1420, the system can generate, based on the characteristics, an image of the object and/or the environment.

Figure 15:
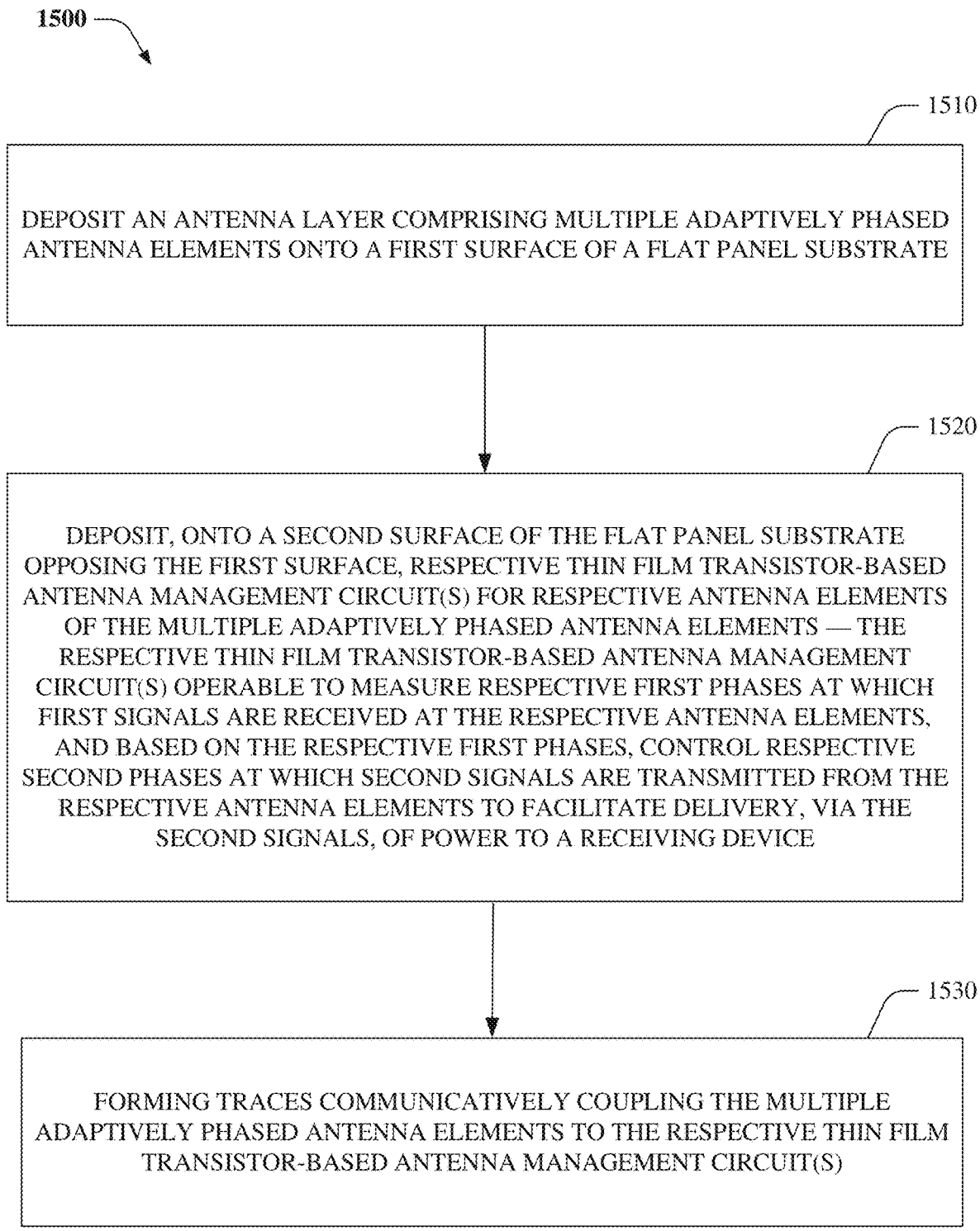
FIG. 15, illustrates a method of manufacturing TFT-based antenna management circuits and multiple adaptively phased antenna elements on respective opposing surfaces of a flat panel substrate, in accordance with various example embodiments.

FIG. 15 illustrates a method of manufacturing TFT-based antenna management circuits and multiple adaptively phased antenna elements on respective opposing surfaces of a flat panel substrate, in accordance with various example embodiments. At 1510, an antenna layer comprising multiple adaptively phased antenna elements can be deposited onto a first surface of a flat panel substrate. At 1520, respective TFT-based antenna management circuit(s) for respective antenna elements of the multiple adaptively phased antenna elements can be deposited onto a second surface of the flat panel substrate opposing the first surface. In this regard, the respective TFT-based antenna management circuit(s) are operable to measure respective first phases at which first signals are received at the respective antenna elements, and based on the respective first phases, control respective second phases at which second signals are transmitted from the respective antenna elements to facilitate delivery, via the second signals, of power to a receiving device. At 1530, traces communicatively coupling the multiple adaptively phased antenna elements to the respective TFT-based antenna management circuit(s) can be formed.

In other embodiment(s) (not shown), a mixed process can also be employed that uses TFT-based process(es) for manufacturing low-frequency digital/analog electronics, e.g., corresponding to the multiple adaptively phased antenna element(s) and/or the respective TFT-based antenna management circuits, and a gallium arsenide (GaAs) semiconductor process for manufacturing RF portions, e.g., of the multiple adaptively phased antenna element(s) and/or the respective TFT-based antenna management circuits, to enable finer features size, higher efficiency transistors, etc.

Figure 16:
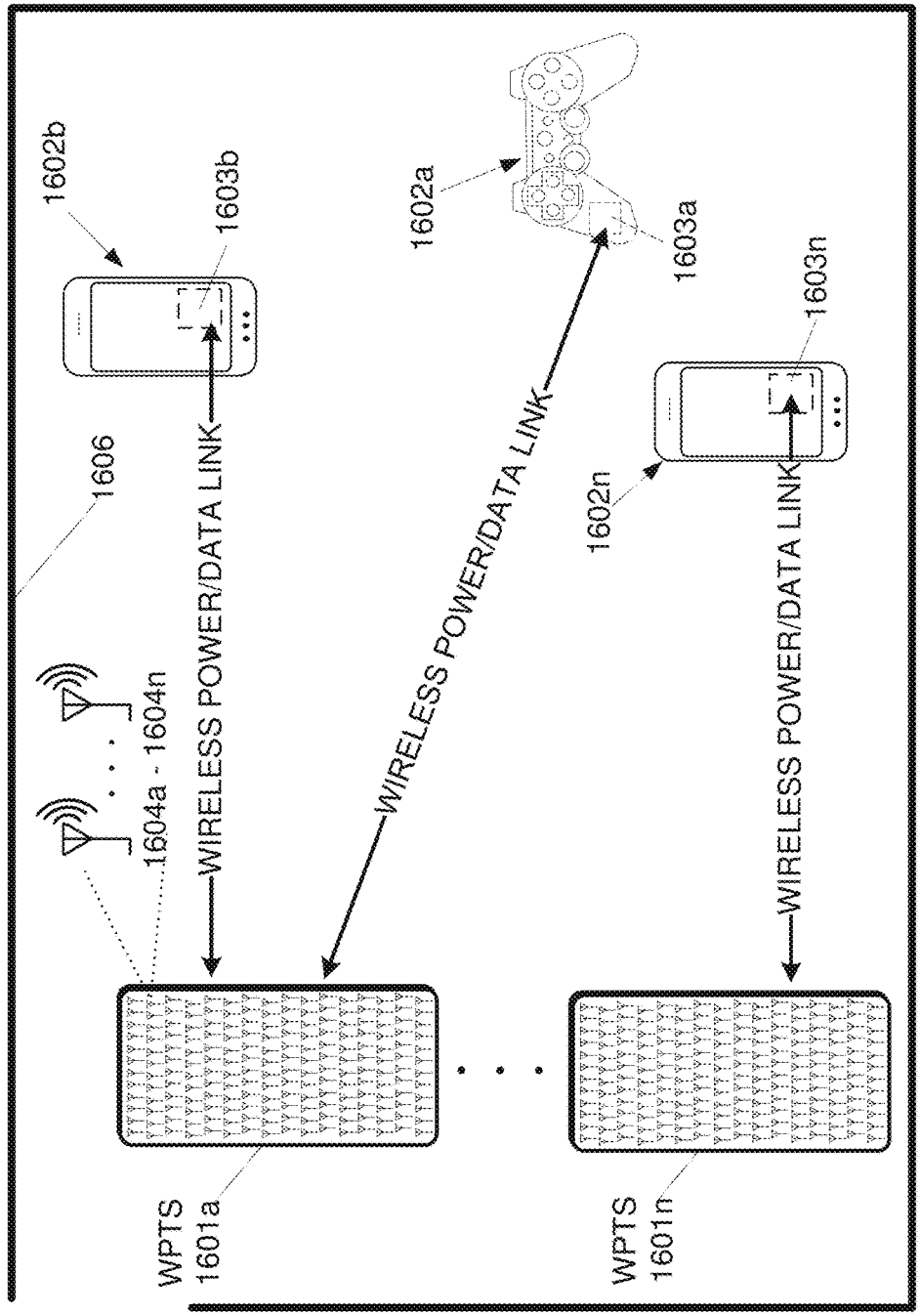
FIG. 16 depicts a block diagram of an example wireless power delivery environment illustrating wireless power delivery from one or more wireless power transmission systems to various wireless devices within the wireless power delivery environment, in accordance with various example embodiments.

FIG. 16 depicts a block diagram including an example wireless power delivery environment 1600 illustrating wireless power delivery from one or more wireless power transmission systems (WPTS) 1601a-n (also referred to as "wireless power delivery systems", "antenna array systems" and "wireless chargers") to various wireless devices 1602a-n within the wireless power delivery environment 1600, according to some embodiments. More specifically, FIG. 16 illustrates an example wireless power delivery environment 1600 in which wireless power and/or data can be delivered to available wireless devices 1602a-1602n having one or more wireless power receiver clients 1603a-1603n (also referred to herein as "clients" and "wireless power receivers"). The wireless power receiver clients are configured to receive and process wireless power from one or more wireless power transmission systems 1601a-1601n. Components of an example wireless power receiver client 1603 are shown and discussed in greater detail with reference to FIG. 19.

As shown in the example of FIG. 16, the wireless devices 1602a-1602n include mobile phone devices and a wireless game controller. However, the wireless devices 1602a-1602n can be any device or system that needs power and is capable of receiving wireless power via one or more integrated wireless power receiver clients 1603a-1603n. As discussed herein, the one or more integrated wireless power receiver clients receive and process power from one or more wireless power transmission systems 1601a-1601n and provide the power to the wireless devices 1602a-1602n (or internal batteries of the wireless devices) for operation thereof.

Each wireless power transmission system 1601 can include multiple antennas 1604a-n, e.g., an antenna array including hundreds or thousands of antennas, which are capable of delivering wireless power to wireless devices 1602a-1602n. In some embodiments, the antennas are adaptively-phased RF antennas. The wireless power transmission system 1601 is capable of determining the appropriate phases with which to deliver a coherent power transmission signal to the wireless power receiver clients 1603a-1603n. The array is configured to emit a signal (e.g., continuous wave or pulsed power transmission signal) from multiple antennas at a specific phase relative to each other. It is appreciated that use of the term "array" does not necessarily limit the antenna array to any specific array structure. That is, the antenna array does not need to be structured in a specific "array" form or geometry. Furthermore, as used herein the term "array" or "array system" may include related and peripheral circuitry for signal generation, reception and transmission, such as radios, digital logic and modems. In some embodiments, the wireless power transmission system 1601 can have an embedded WiFi hub for data communications via one or more antennas or transceivers.

The wireless devices 1602 can include one or more wireless power receiver clients 1603. As illustrated in the example of FIG. 16, power delivery antennas 1604a-1604n are shown. The power delivery antennas 1604a are configured to provide delivery of wireless radio frequency power in the wireless power delivery environment. In some embodiments, one or more of the power delivery antennas 1604a-1604n can alternatively or additionally be configured for data communications in addition to or in lieu of wireless power delivery. The one or more data communication antennas are configured to send data communications to and receive data communications from the wireless power receiver clients 1603a-1603n and/or the wireless devices 1602a-1602n. In some embodiments, the data communication antennas can communicate via Bluetooth™, WiFi™, ZigBee™, etc. Other data communication protocols are also possible.

Each wireless power receiver client 1603a-1603n includes one or more antennas (not shown) for receiving signals from the wireless power transmission systems 1601a-1601n. Likewise, each wireless power transmission system 1601a-1601n includes an antenna array having one or more antennas and/or sets of antennas capable of emitting continuous wave or discrete (pulse) signals at specific phases relative to each other. As discussed above, each of the wireless power transmission systems 1601a-1601n is capable of determining the appropriate phases for delivering the coherent signals to the wireless power receiver clients 1602a-1602n. For example, in some embodiments, coherent signals can be determined by computing the complex conjugate of a received beacon (or calibration) signal at each antenna of the array such that the coherent signal is phased for delivering power to the particular wireless power receiver client that transmitted the beacon (or calibration) signal.

Although not illustrated, each component of the environment, e.g., wireless device, wireless power transmission system, etc., can include control and synchronization mechanisms, e.g., a data communication synchronization module. The wireless power transmission systems 1601a-1601n can be connected to a power source such as, for example, a power outlet or source connecting the wireless power transmission systems to a standard or primary AC power supply in a building. Alternatively, or additionally, one or more of the wireless power transmission systems 1601a-1601n can be powered by a battery or via other mechanisms, e.g., solar cells, etc.

The wireless power receiver clients 1602a-1602n and/or the wireless power transmission systems 1601a-1601n are configured to operate in a multipath wireless power delivery environment. That is, the wireless power receiver clients 1602a-1602n and the wireless power transmission systems 1601a-1601n are configured to utilize reflective objects 1606 such as, for example, walls or other RF reflective obstructions within range to transmit beacon (or calibration) signals and/or receive wireless power and/or data within the wireless power delivery environment. The reflective objects 1606 can be utilized for multi-directional signal communication regardless of whether a blocking object is in the line of sight between the wireless power transmission system and the wireless power receiver clients 1603a-1603n.

As described herein, each wireless device 1602a-1602n can be any system and/or device, and/or any combination of devices/systems that can establish a connection with another device, a server and/or other systems within the example environment 1600. In some embodiments, the wireless devices 1602a-1602n include displays or other output functionalities to present data to a user and/or input functionalities to receive data from the user. By way of example, a wireless device 1602 can be, but is not limited to, a video game controller, a server desktop, a desktop computer, a computer cluster, a mobile computing device such as a notebook, a laptop computer, a handheld computer, a mobile phone, a smart phone, a PDA, a Blackberry device, a Treo, and/or an iPhone, etc. By way of example and not limitation, the wireless device 1602 can also be any wearable device such as watches, necklaces, rings or even devices embedded on or within the customer. Other examples of a wireless device 1602 include, but are not limited to, safety sensors (e.g., fire or carbon monoxide), electric toothbrushes, electronic door lock/handles, electric light switch controller, electric shavers, etc.

Although not illustrated in the example of FIG. 16, the wireless power transmission system 1601 and the wireless power receiver clients 1603a-1603n can each include a data communication module for communication via a data channel. Alternatively, or additionally, the wireless power receiver clients 1603a-1603n can direct the wireless devices 1602a-1602n to communicate with the wireless power transmission system via existing data communications modules. In some embodiments, the beacon signal, which is primarily referred to herein as a continuous waveform, can alternatively or additionally take the form of a modulated signal.

Figure 17:
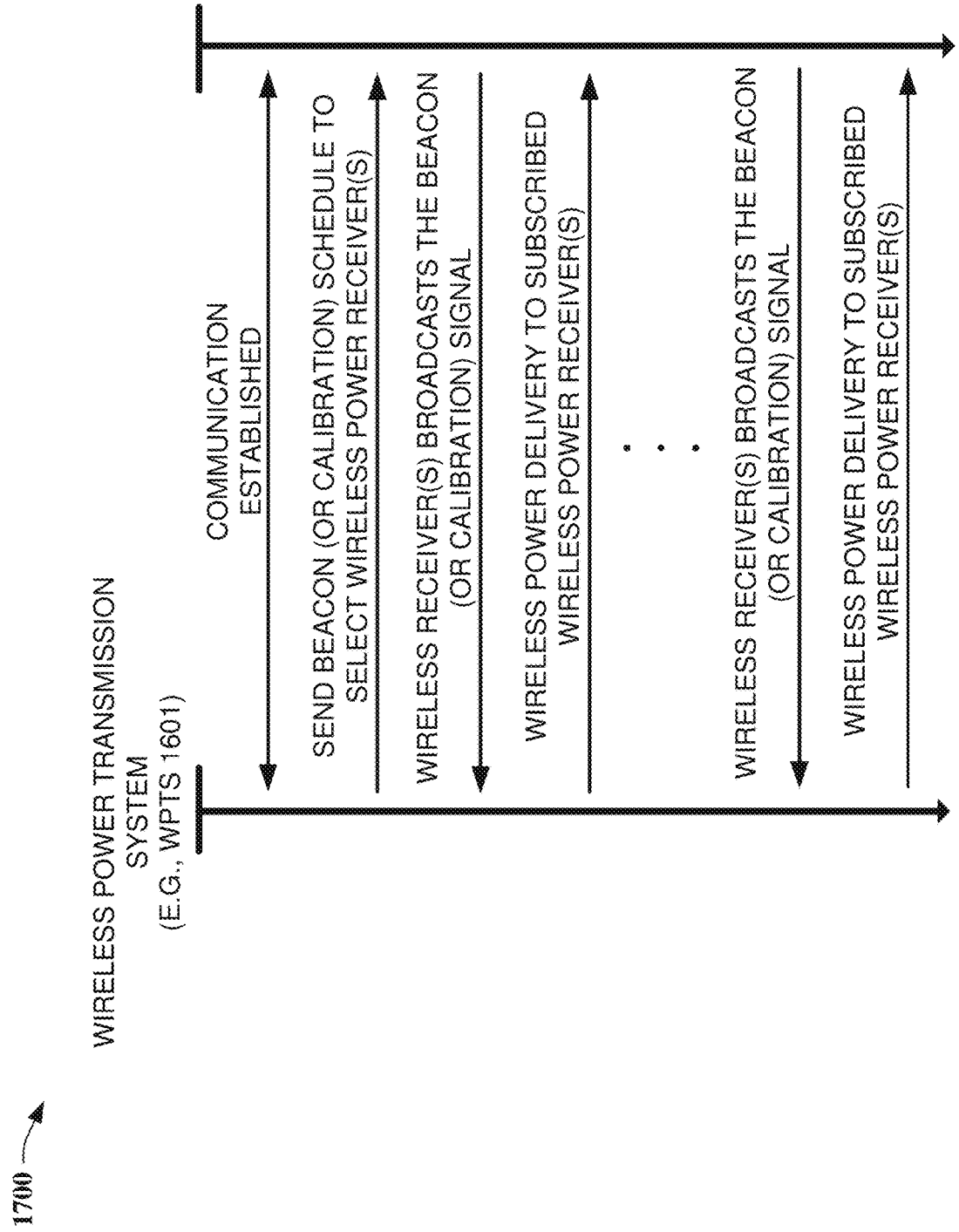
FIG. 17 depicts a sequence diagram illustrating example operations between a wireless power transmission system and a wireless receiver client for commencing wireless power delivery, in accordance with various example embodiments.

FIG. 17 depicts a sequence diagram 1700 illustrating example operations between a wireless power delivery system (e.g., tile system 110, AMB system 915, wireless power transmission system 1601, etc.) and a wireless power receiver client 1603 for establishing wireless power delivery in a multipath wireless power delivery, according to an embodiment. Initially, communication is established between the wireless power delivery system and the power receiver client. The initial communication can be, for example, a data communication link that is established via one or more antennas (e.g., 1604a-1604n) of the wireless power transmission system. As discussed, in some embodiments, one or more of the antennas can be data antennas, wireless power transmission antennas, or dual-purpose data/power antennas. Various information can be exchanged between the wireless power transmission system and the wireless power receiver client over this data communication channel. For example, wireless power signaling can be time sliced among various clients in a wireless power delivery environment. In such cases, the wireless power transmission system can send beacon schedule information, e.g., Beacon Beat Schedule (BBS) cycle, power cycle information, etc., so that the wireless power receiver client knows when to transmit (broadcast) its beacon signals and when to listen for power, etc.

Continuing with the example of FIG. 17, the wireless power transmission system selects one or more wireless power receiver clients for receiving power and sends the beacon schedule information to the selected wireless power receiver clients. The wireless power transmission system can also send power transmission scheduling information so that the wireless power receiver client knows when to expect (e.g., a window of time) wireless power from the wireless power transmission system. The wireless power receiver client then generates a beacon (or calibration) signal and broadcasts the beacon during an assigned beacon transmission window (or time slice) indicated by the beacon schedule information, e.g., BBS cycle. As discussed herein, the wireless power receiver client includes one or more antennas (or transceivers) that have a radiation and reception pattern in three-dimensional space proximate to the wireless device in which the wireless power receiver client is embedded.

The wireless power transmission system receives the beacon from the power receiver client and detects and/or otherwise measures the phase (or direction) from which the beacon signal is received at multiple antennas. The wireless power transmission system then delivers wireless power to the power receiver client from the multiple antennas based on the detected or measured phase (or direction) of the received beacon at each of the corresponding antennas. In some embodiments, the wireless power transmission system determines the complex conjugate of the measured phase of the beacon and uses the complex conjugate to determine a transmit phase that configures the antennas for delivering and/or otherwise directing wireless power to the wireless power receiver client via the same path over which the beacon signal was received from the wireless power receiver client.

In some embodiments, the wireless power transmission system includes many antennas. One or more of the many antennas may be used to deliver power to the power receiver client. The wireless power transmission system can detect and/or otherwise determine or measure phases at which the beacon signals are received at each antenna. The large number of antennas may result in different phases of the beacon signal being received at each antenna of the wireless power transmission system. As discussed above, the wireless power transmission system can determine the complex conjugate of the beacon signals received at each antenna. Using the complex conjugates, one or more antennas may emit a signal that takes into account the effects of the large number of antennas in the wireless power transmission system. In other words, the wireless power transmission system can emit a wireless power transmission signal from one or more antennas in such a way as to create an aggregate signal from the one or more of the antennas that approximately recreates the waveform of the beacon in the opposite direction. Said another way, the wireless power transmission system can deliver wireless RF power to the wireless power receiver clients via the same paths over which the beacon signal is received at the wireless power transmission system. These paths can utilize reflective objects 1606 within the environment. Additionally, the wireless power transmission signals can be simultaneously transmitted from the wireless power transmission system such that the wireless power transmission signals collectively match the antenna radiation and reception pattern of the client device in a three-dimensional (3D) space proximate to the client device.

As shown, the beacon (or calibration) signals can be periodically transmitted by wireless power receiver clients within the power delivery environment according to, for example, the BBS, so that the wireless power transmission system can maintain knowledge and/or otherwise track the location of the power receiver clients in the wireless power delivery environment. The process of receiving beacon signals from a wireless power receiver client at the wireless power transmission system and, in turn, responding with wireless power directed to that particular wireless power receiver client is referred to herein as retrodirective wireless power delivery.

Furthermore, as discussed herein, wireless power can be delivered in power cycles defined by power schedule information. A more detailed example of the signaling required to commence wireless power delivery is described now with reference to FIG. 18.

Figure 18:
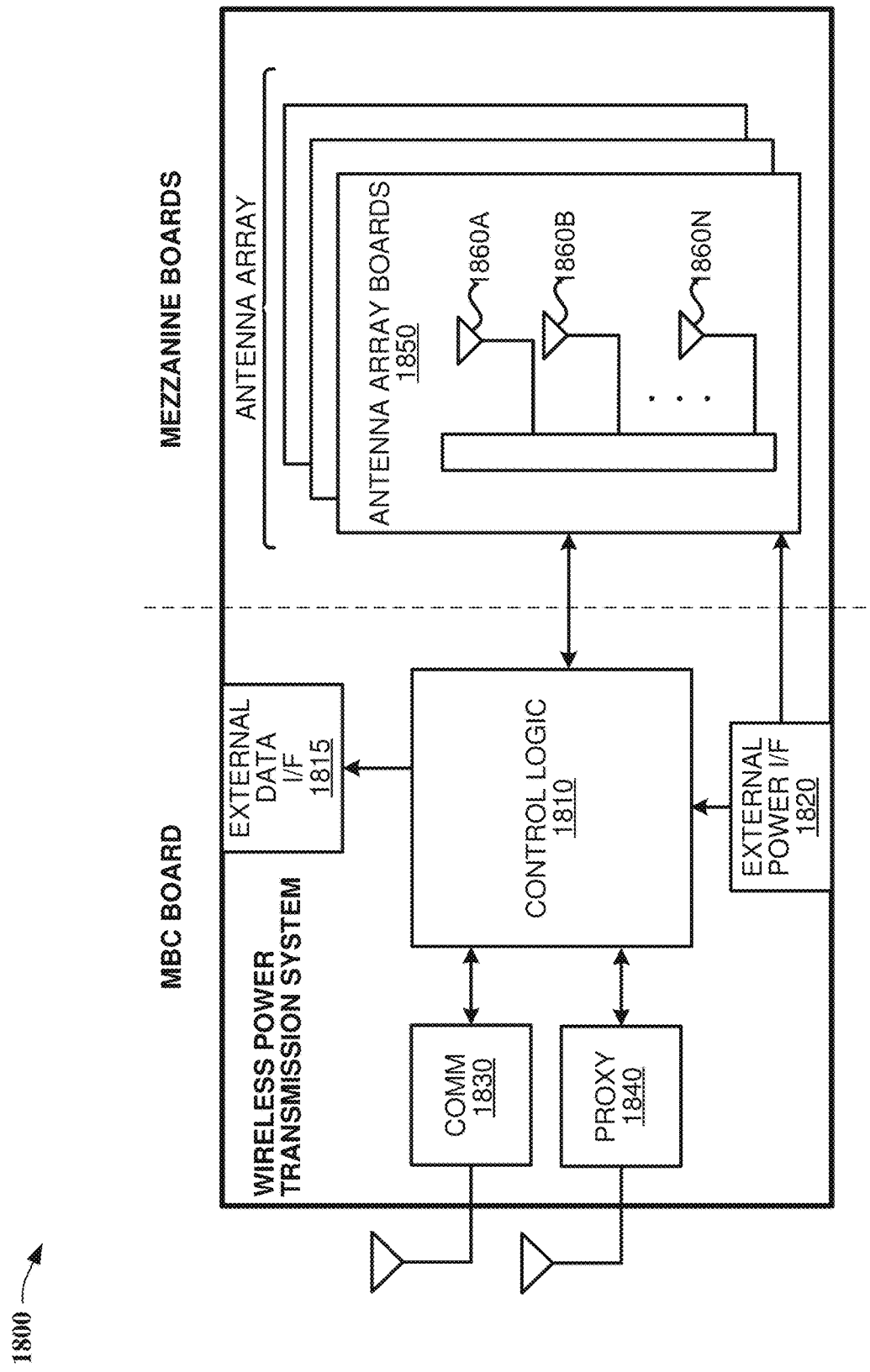
FIG. 18 depicts a block diagram illustrating example components of a wireless power transmission system, in accordance with various example embodiments.

FIG. 18 depicts a block diagram illustrating example components of a wireless power transmission system 1800, in accordance with an embodiment. As illustrated in the example of FIG. 18, the wireless power transmission system 1800 includes a master bus controller (MBC) board and multiple mezzanine boards that collectively comprise the antenna array. It should be appreciated that in other embodiment(s) (not shown), the wireless power transmission system 1800 can be communicatively coupled to AMUs 150, e.g., in addition to, or in lieu of, being communicatively coupled to the antenna array via the multiple mezzanine boards. In this regard, one or more component(s) of the MBC can be communicatively coupled to tile system 110, AMB system 915, group of AMBs 1120, etc. to facilitate performance of one or more operations described herein with respect to a wireless power delivery system (e.g., tile system 110, AMB system 915, group of AMBs 1120, antenna control system 310, WPTS 1601, and/or WPTS 1800, etc.)

The MBC includes control logic 1810, an external data interface (I/F) 1815, an external power interface (I/F) 1820, a communication block 1830 and proxy 1840. The mezzanine boards (or antenna array boards 1850) each include multiple antennas 1860a-1860n. Some or all of the components can be omitted in some embodiments. Additional components are also possible. For example, in some embodiments only one of communication block 1830 or proxy 1840 may be included.

The control logic 1810 is configured to provide control and intelligence to the array components. The control logic 1810 may comprise one or more processors, FPGAs, memory units, etc., and direct and control the various data and power communications. The communication block 1830 can direct data communications on a data carrier frequency, such as the base signal clock for clock synchronization. The data communications can be Bluetooth™, WiFi™, ZigBee™, etc., including combinations or variations thereof. Likewise, the proxy 1840 can communicate with clients via data communications as discussed herein. The data communications can be, by way of example and not limitation, Bluetooth™, WiFi™, ZigBee™, etc. Other communication protocols are possible.

In some embodiments, the control logic 1810 can also facilitate and/or otherwise enable data aggregation for Internet of Things (IoT) devices. In some embodiments, wireless power receiver clients can access, track and/or otherwise obtain IoT information about the device in which the wireless power receiver client is embedded and provide that IoT information to the wireless power transmission system over a data connection. This IoT information can be provided to via an external data interface 1815 to a central or cloud-based system (not shown) where the data can be aggregated, processed, etc. For example, the central system can process the data to identify various trends across geographies, wireless power transmission systems, environments, devices, etc. In some embodiments, the aggregated data and or the trend data can be used to improve operation of the devices via remote updates, etc. Alternatively, or additionally, in some embodiments, the aggregated data can be provided to third party data consumers. In this manner, the wireless power transmission system acts as a Gateway or Enabler for the IoT devices. By way of example and not limitation, the IoT information can include capabilities of the device in which the wireless power receiver client is embedded, usage information of the device, power levels of the device, information obtained by the device or the wireless power receiver client itself, e.g., via sensors, etc.

The external power interface 1820 is configured to receive external power and provide the power to various components. In some embodiments, the external power interface 1820 may be configured to receive a standard external 24 Volt power supply. In other embodiments, the external power interface 1820 can be, for example, 120/240 Volt alternating current (AC) mains to an embedded direct current (DC) power supply that sources the required 12/24/48 Volt DC to provide the power to various components. Alternatively, the external power interface could be a DC supply that sources the required 12/24/48 Volts DC. Alternative configurations are also possible.

In operation, the MBC, which controls the wireless power transmission system, receives power from a power source and is activated. The MBC then activates proxy antenna elements (e.g., 210, 1860*a*-1860*n*, etc.) on the wireless power transmission system and the proxy antenna elements enter a default "discovery" mode to identify available wireless receiver clients within range of the wireless power transmission system. When a client is found, the antenna elements on the wireless power transmission system power on, enumerate, and (optionally) calibrate.

The MBC then generates beacon transmission scheduling information and power transmission scheduling information during a scheduling process. The scheduling process includes selection of power receiver clients. For example, the MBC can select power receiver clients for power transmission and generate a BBS cycle and a Power Schedule (PS) for the selected wireless power receiver clients. As discussed herein, the power receiver clients can be selected based on their corresponding properties and/or requirements.

In some embodiments, the MBC can also identify and/or otherwise select available clients that will have their status queried in the Client Query Table (CQT). Clients that are placed in the CQT are those on "standby", e.g., not receiving a charge. The BBS and PS are calculated based on vital information about the clients such as, for example, battery status, current activity/usage, how much longer the client has until it runs out of power, priority in terms of usage, etc.

The Proxy Antenna Element (AE) broadcasts the BBS to all clients. As discussed herein, the BBS indicates when each client should send a beacon. Likewise, the PS indicates when and to which clients the array should send power to and when clients should listen for wireless power. Each client starts broadcasting its beacon and receiving power from the array per the BBS and PS. The Proxy AE can concurrently query the Client Query Table to check the status of other available clients. In some embodiments, a client can only exist in the BBS or the CQT (e.g., waitlist), but not in both. The information collected in the previous step continuously and/or periodically updates the BBS cycle and/or the PS.

Figure 19:
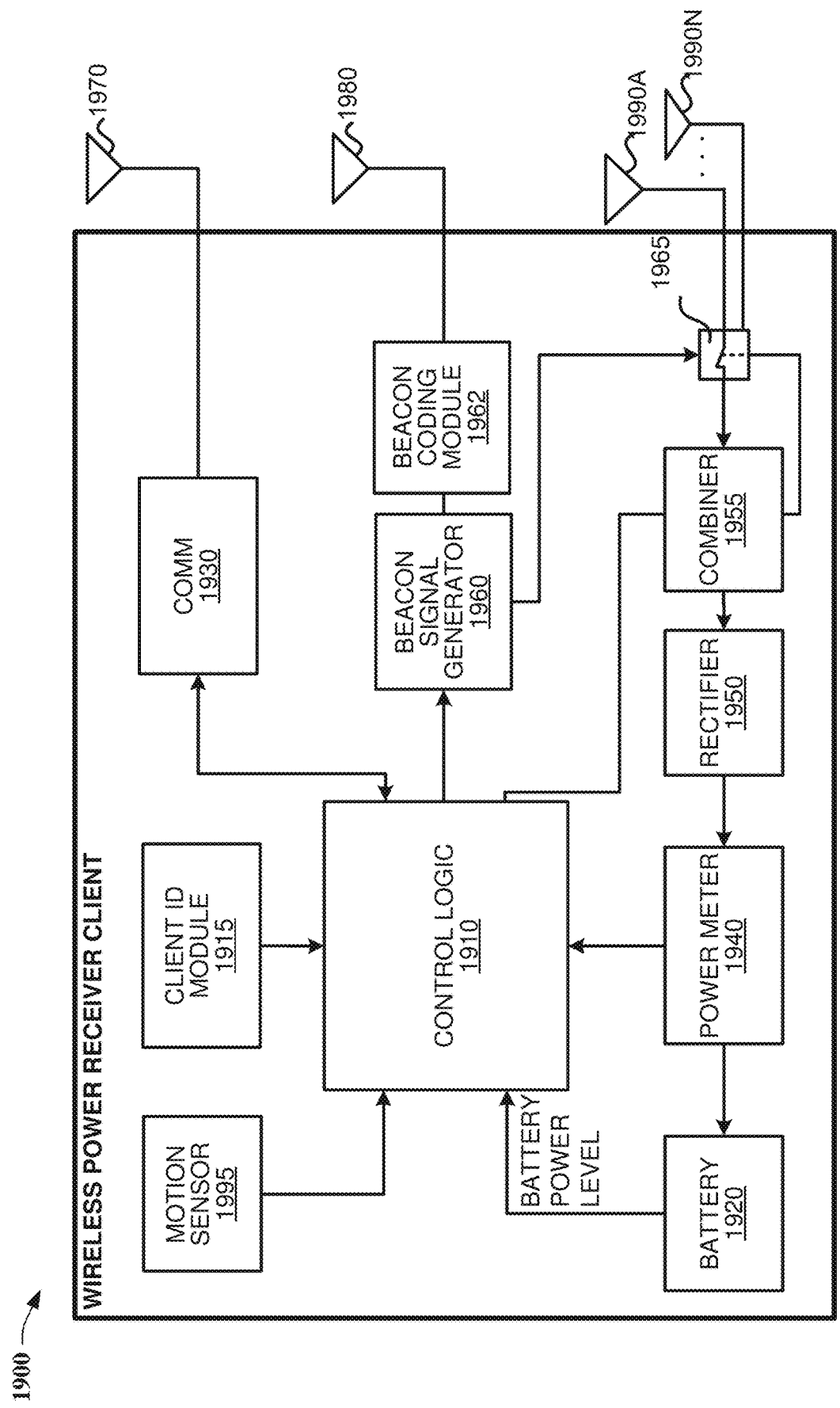
FIG. 19 depicts a block diagram illustrating example components of a wireless power receiver client, in accordance with various example embodiments.

FIG. 19 is a block diagram illustrating example components of a wireless power receiver client 1900, in accordance with some embodiments. As illustrated in the example of FIG. 19, the wireless power receiver client 1900 includes control logic 1910, battery 1920, an IoT control module 1925, communication block 1930 and associated antenna 1970, power meter 1940, rectifier 1950, a combiner 1955, beacon signal generator 1960, beacon coding unit 1962 and an associated antenna 1980, and switch 1965 connecting the rectifier 1950 or the beacon signal generator 1960 to one or more associated antennas 1990*a*-*n*. Some or all of the components can be omitted in some embodiments. For example, in some embodiments, the wireless power receiver client 1900 does not include its own antennas but instead utilizes and/or otherwise shares one or more antennas (e.g., WiFi antenna) of the wireless device (e.g., 510, wireless devices 1602, etc.) in which the wireless power receiver client is embedded. Moreover, in some embodiments, the wireless power receiver client may include a single antenna that provides data transmission functionality as well as power/data reception functionality. Additional components are also possible.

A combiner 1955 receives and combines the received power transmission signals from the power transmitter in the event that the receiver 1900 has more than one antenna. The combiner can be any combiner or divider circuit that is configured to achieve isolation between the output ports while maintaining a matched condition. For example, the combiner 1955 can be a Wilkinson Power Divider circuit. The rectifier 1950 receives the combined power transmission signal from the combiner 1955, if present, which is fed through the power meter 1940 to the battery 1920 for charging. In other embodiments, each antenna's power path can have its own rectifier 1950 and the DC power out of the rectifiers is combined prior to feeding the power meter 1940. The power meter 1940 can measure the received power signal strength and provides the control logic 1910 with this measurement.

Battery 1920 can include protection circuitry and/or monitoring functions. Additionally, the battery 1920 can include one or more features, including, but not limited to, current limiting, temperature protection, over/under voltage alerts and protection, and coulomb monitoring.

The control logic 1910 receives and processes the battery power level from the battery 1920 itself. The control logic 1910 may also transmit/receive via the communication block 1930 a data signal on a data carrier frequency, such as the base signal clock for clock synchronization. The beacon signal generator 1960 generates the beacon signal, or calibration signal, transmits the beacon signal using either the antenna 1980 or 1990 after the beacon signal is encoded.

It may be noted that, although the battery 1920 is shown as charged by, and providing power to, the wireless power receiver client 1900, the receiver may also receive its power directly from the rectifier 1950. This may be in addition to the rectifier 1950 providing charging current to the battery 1920, or in lieu of providing charging. Also, it may be noted that the use of multiple antennas is one example of implementation and the structure may be reduced to one shared antenna.

In some embodiments, the control logic 1910 and/or the IoT control module 1925 can communicate with and/or otherwise derive IoT information from the device in which the wireless power receiver client 1900 is embedded. Although not shown, in some embodiments, the wireless power receiver client 1900 can have one or more data connections (wired or wireless) with the device in which the wireless power receiver client 1900 is embedded over which IoT information can be obtained. Alternatively, or additionally, IoT information can be determined and/or inferred by the wireless power receiver client 1900, e.g., via one or more sensors. As discussed above, the IoT information can include, but is not limited to, information about the capabilities of the device in which the wireless power receiver client 1900 is embedded, usage information of the device in which the wireless power receiver client 1900 is embedded, power levels of the battery or batteries of the device in which the wireless power receiver client 1900 is embedded, and/or information obtained or inferred by the device in which the wireless power receiver client is embedded or the wireless power receiver client itself, e.g., via sensors, etc.

In some embodiments, a client identifier (ID) module 1915 stores a client ID that can uniquely identify the wireless power receiver client 1900 in a wireless power delivery environment. For example, the ID can be transmitted to one or more wireless power transmission systems when communication is established. In some embodiments, wireless power receiver clients may also be able to receive and identify other wireless power receiver clients in a wireless power delivery environment based on the client ID.

An optional motion sensor 1995 can detect motion and signal the control logic 1910 to act accordingly. For example, a device receiving power may integrate motion detection mechanisms such as accelerometers or equivalent mechanisms to detect motion. Once the device detects that it is in motion, it may be assumed that it is being handled by a user, and would trigger a signal to the array to either to stop transmitting power, or to lower the power transmitted to the device. In some embodiments, when a device is used in a moving environment like a car, train or plane, the power might only be transmitted intermittently or at a reduced level unless the device is critically low on power.

Figure 20A:
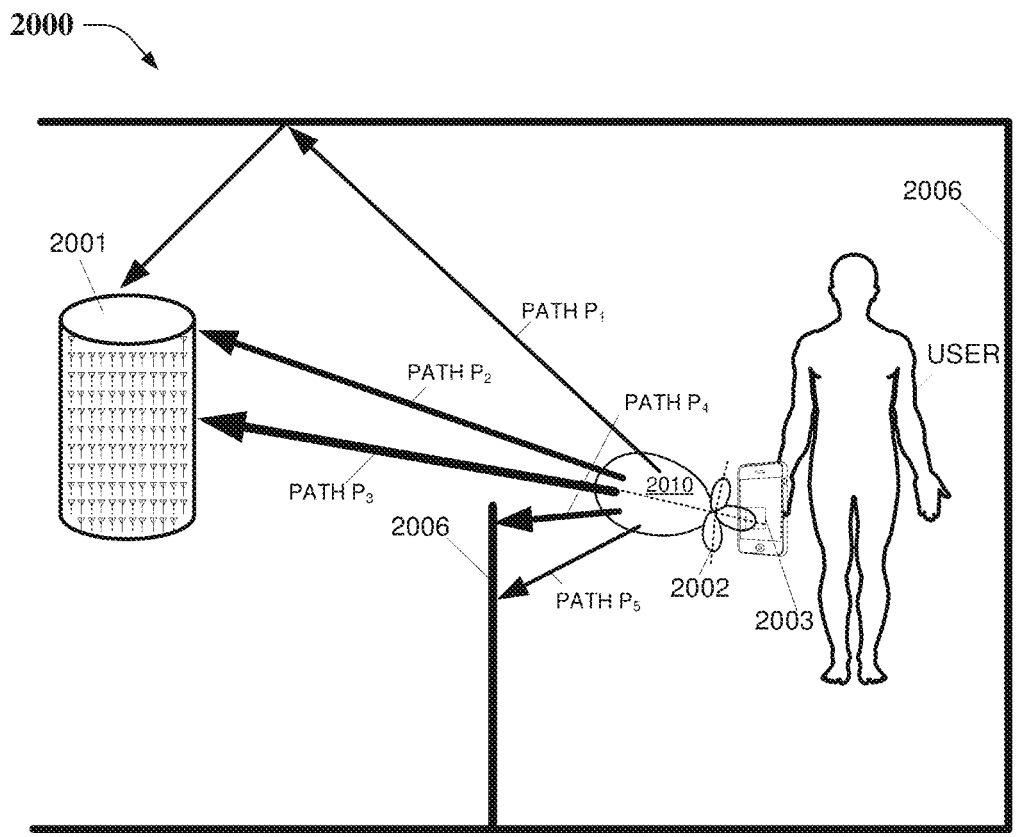
FIGS. 20A and 20B depict block diagrams illustrating example multipath wireless power delivery environments, in accordance with various example embodiments.
Figure 20B:
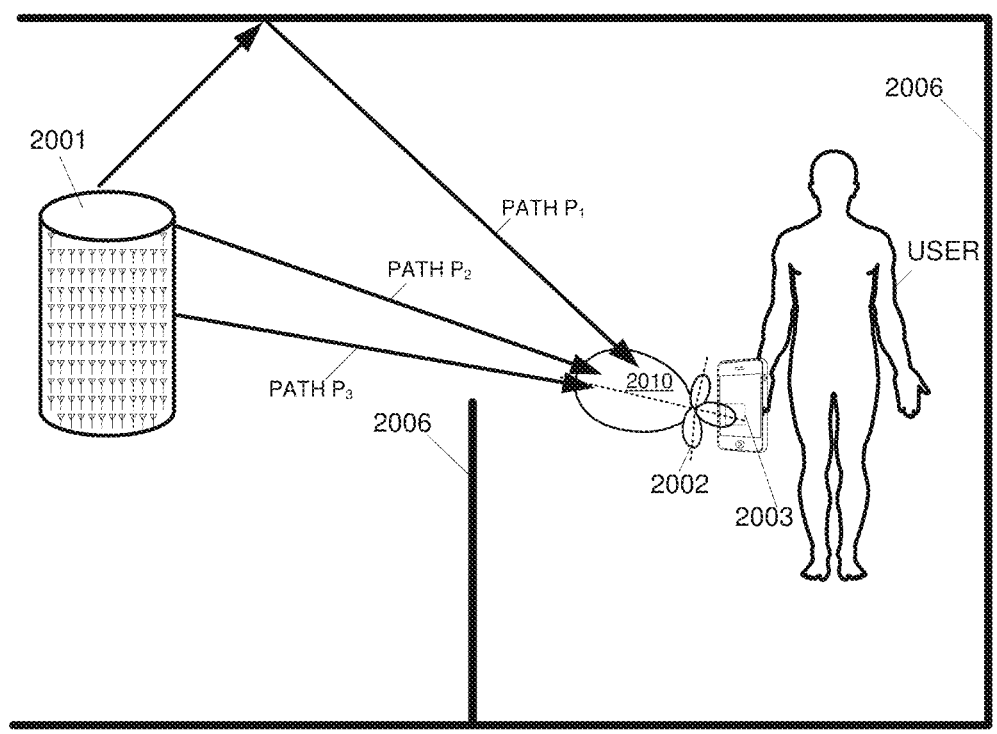

FIGS. 20A and 20B depict diagrams illustrating an example multipath wireless power delivery environment 2000, according to some embodiments. The multipath wireless power delivery environment 2000 includes a user operating a wireless device (e.g., 510, 2002, etc.) including one or more wireless power receiver clients (e.g., 2003). The wireless device 2002 can be wireless device 510, wireless device 1602, etc.; and the one or more wireless power receiver clients 2003 can be the wireless power receiver client 1603 or the wireless power receiver client 1900, although alternative configurations are possible. Likewise, wireless power transmission system 2001 can be wireless power transmission system 1601 or wireless power transmission system 1800, although alternative configurations are possible. The multipath wireless power delivery environment 2000 includes reflective objects 2006 and various absorptive objects, e.g., users, or humans, furniture, etc.

Wireless device 2002 includes one or more antennas (or transceivers) that have a radiation and reception pattern 2010 in three-dimensional space proximate to the wireless device 2002. The one or more antennas (or transceivers) can be wholly or partially included as part of the wireless device 2002 and/or the wireless power receiver client (not shown). For example, in some embodiments one or more antennas, e.g., WiFi, Bluetooth, etc. of the wireless device 2002 can be utilized and/or otherwise shared for wireless power reception. As shown in the examples of FIGS. 20A and 20B, the radiation and reception pattern 2010 comprises a lobe pattern with a primary lobe and multiple side lobes. Other patterns are also possible.

The wireless device 2002 transmits a beacon (or calibration) signal over multiple paths to the wireless power transmission system 2001. As discussed herein, the wireless device 2002 transmits the beacon in the direction of the radiation and reception pattern 2010 such that the strength of the received beacon signal by the wireless power transmission system, e.g., received signal strength indication (RSSI), depends on the radiation and reception pattern 2010. For example, beacon signals are not transmitted where there are nulls in the radiation and reception pattern 2010 and beacon signals are the strongest at the peaks in the radiation and reception pattern 2010, e.g., peak of the primary lobe. As shown in the example of FIG. 20A, the wireless device 2002 transmits beacon signals over five paths P1-P5. Paths P4 and P5 are blocked by reflective and/or absorptive object 2006. The wireless power transmission system 2001 receives beacon signals of increasing strengths via paths P1-P3. The bolder lines indicate stronger signals. In some embodiments, the beacon signals are directionally transmitted in this manner, for example, to avoid unnecessary RF energy exposure to the user.

A fundamental property of antennas is that the receiving pattern (sensitivity as a function of direction) of an antenna when used for receiving is identical to the far-field radiation pattern of the antenna when used for transmitting. This is a consequence of the reciprocity theorem in electromagnetism. As shown in the example of FIGS. 20A and 20B, the radiation and reception pattern 2010 is a three-dimensional lobe shape. However, the radiation and reception pattern 2010 can be any number of shapes depending on the type or types, e.g., horn antennas, simple vertical antenna, etc. used in the antenna design. For example, the radiation and reception pattern 2010 can comprise various directive patterns. Any number of different antenna radiation and reception patterns are possible for each of multiple client devices in a wireless power delivery environment.

Referring again to FIG. 20A, the wireless power transmission system 2001 receives the beacon (or calibration) signal via multiple paths P1-P3 at multiple antennas or transceivers. As shown, paths P2 and P3 are direct line of sight paths while path P1 is a non-line of sight path. Once the beacon (or calibration) signal is received by the wireless power transmission system 2001, the power transmission system 2001 processes the beacon (or calibration) signal to determine one or more receive characteristics of the beacon signal at each of the multiple antennas. For example, among other operations, the wireless power transmission system 2001 can measure the phases at which the beacon signal is received at each of the multiple antennas or transceivers.

The wireless power transmission system 2001 processes the one or more receive characteristics of the beacon signal at each of the multiple antennas to determine or measure one or more wireless power transmit characteristics for each of the multiple RF transceivers based on the one or more receive characteristics of the beacon (or calibration) signal as measured at the corresponding antenna or transceiver. By way of example and not limitation, the wireless power transmit characteristics can include phase settings for each antenna or transceiver, transmission power settings, etc.

As discussed herein, the wireless power transmission system 2001 determines the wireless power transmit characteristics such that, once the antennas or transceivers are configured, the multiple antennas or transceivers are operable to transit a wireless power signal that matches the client radiation and reception pattern in the three-dimensional space proximate to the client device. FIG. 20B illustrates the wireless power transmission system 2001 transmitting wireless power via paths P1-P3 to the wireless device 2002. Advantageously, as discussed herein, the wireless power signal matches the client radiation and reception pattern 2010 in the three-dimensional space proximate to the client device. Said another way, the wireless power transmission system will transmit the wireless power signals in the direction in which the wireless power receiver has maximum gain, e.g., will receive the most wireless power. As a result, no signals are sent in directions in which the wireless power receiver cannot receive power, e.g., nulls and blockages. In some embodiments, the wireless power transmission system 2001 measures the RSSI of the received beacon signal and if the beacon is less than a threshold value, the wireless power transmission system will not send wireless power over that path.

The three paths shown in the examples of FIGS. 20A and 20B are illustrated for simplicity, it is appreciated that any number of paths can be utilized for transmitting power to the wireless device 2002 depending on, among other factors, reflective and absorptive objects in the wireless power delivery environment. Although the example of FIG. 20A illustrates transmitting a beacon (or calibration) signal in the direction of the radiation and reception pattern 2010, it is appreciated that, in some embodiments, beacon signals can alternatively or additionally be omni-directionally transmitted.

Figure 21:
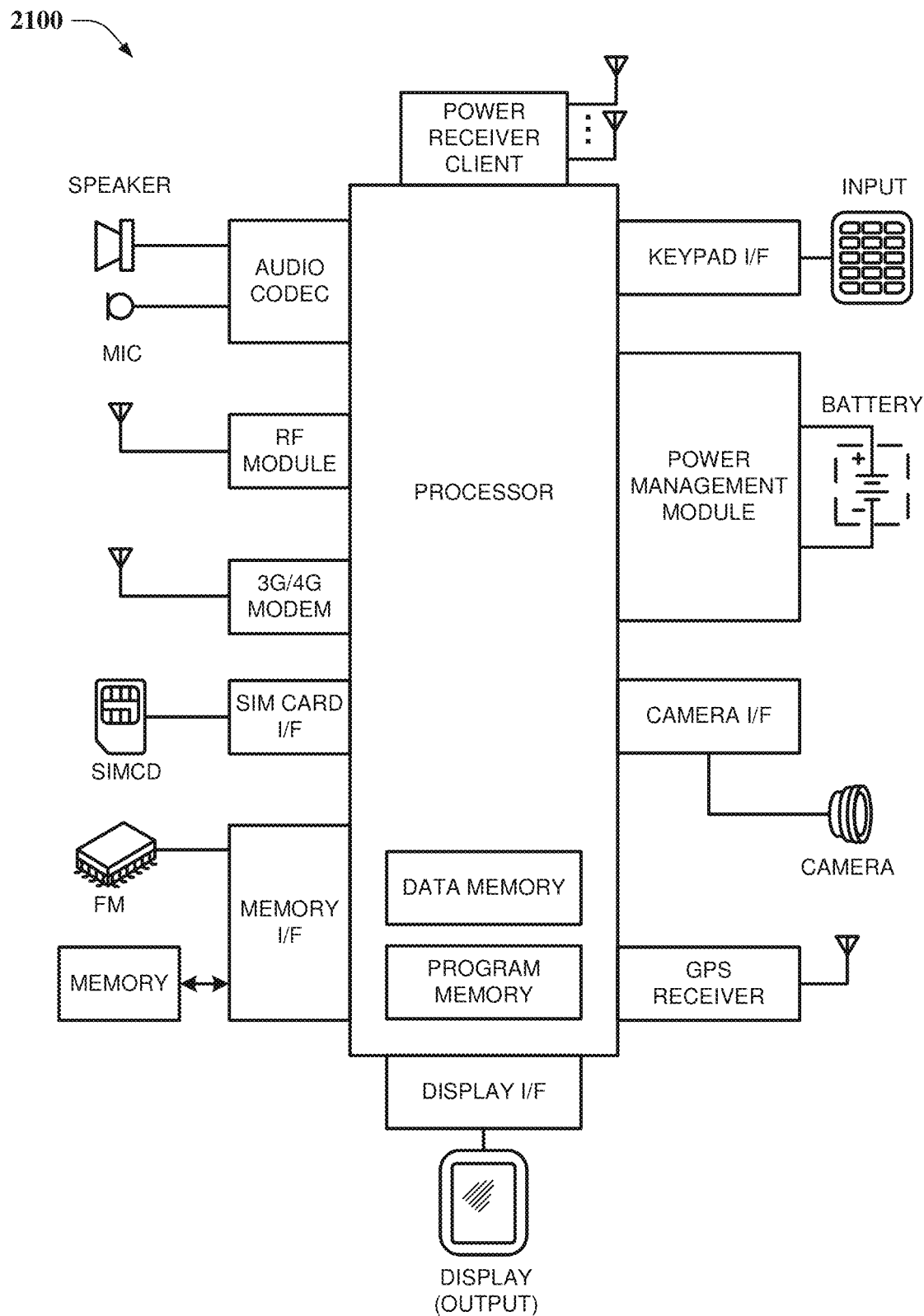
FIG. 21 depicts a block diagram illustrating example components of a representative mobile device or tablet computer with a wireless power receiver or client in the form of a mobile (or smart) phone or tablet computer device, in accordance with various example embodiments.

FIG. 21 depicts a block diagram illustrating example components of a representative mobile device (e.g., 510) or tablet computer 2100 with a wireless power receiver or client in the form of a mobile (or smart) phone or tablet computer device, according to an embodiment. Various interfaces and modules are shown with reference to FIG. 21, however, the mobile device or tablet computer does not require all of modules or functions for performing the functionality described herein. It is appreciated that, in many embodiments, various components are not included and/or necessary for operation of the category controller. For example, components such as GPS radios, cellular radios, and accelerometers may not be included in the controllers to reduce costs and/or complexity. Additionally, components such as ZigBee radios and RF identification (RFID) transceivers, along with antennas, can populate a PCB.

The wireless power receiver client can be a power receiver client 1603 of FIG. 16, although alternative configurations are possible. Additionally, the wireless power receiver client can include one or more RF antennas for reception of power and/or data signals from a charger, e.g., WPTS 1601 of FIG. 16.

Figure 22:
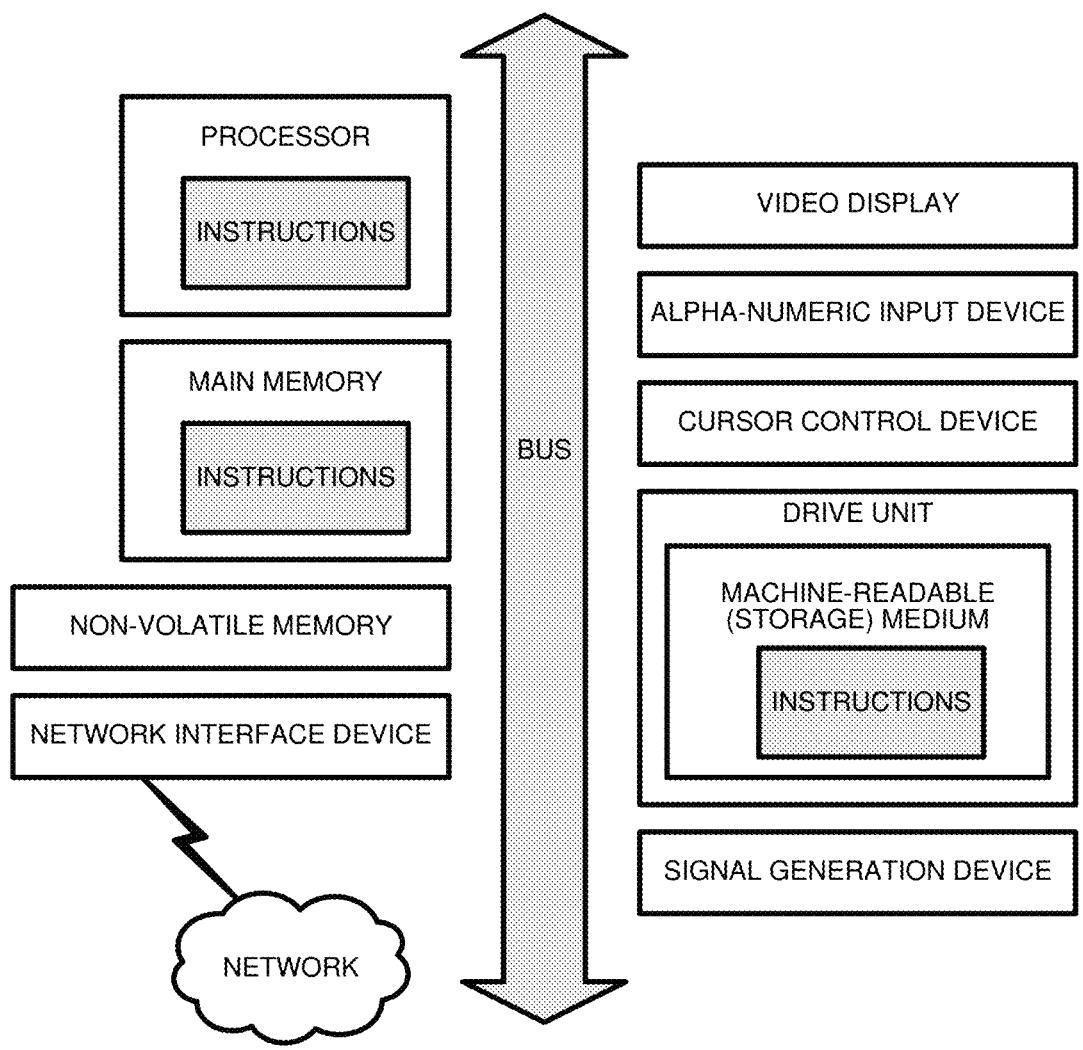
FIG. 22 depicts a diagrammatic representation of a machine, in an example form, of a computer system within which a set of instructions, for causing the machine to perform any one or more of the methodologies discussed herein, may be executed, in accordance with various example embodiments.

FIG. 22 depicts a diagrammatic representation of a machine, in the example form, of a computer system within which a set of instructions, for causing the machine to perform any one or more of the methodologies discussed herein, may be executed.

In the example of FIG. 22, the computer system includes a processor, memory, non-volatile memory, and an interface device. Various common components (e.g., cache memory) are omitted for illustrative simplicity. The computer system 2200 is intended to illustrate a hardware device on which any of the components depicted, e.g., in FIG. 1, FIG. 16, etc. (and any other components described in this specification) can be implemented. For example, the computer system can be any radiating object or antenna array system. The computer system can be of any applicable known or convenient type. The components of the computer system can be coupled together via a bus or through some other known or convenient device.

The processor may be, for example, a conventional microprocessor such as an Intel Pentium microprocessor or Motorola power PC microprocessor. One of skill in the relevant art will recognize that the terms "machine-readable (storage) medium" or "computer-readable (storage) medium" include any type of device that is accessible by the processor.

The memory is coupled to the processor by, for example, a bus. The memory can include, by way of example but not limitation, random access memory (RAM), such as dynamic RAM (DRAM) and static RAM (SRAM). The memory can be local, remote, or distributed.

The bus also couples the processor to the non-volatile memory and drive unit. The non-volatile memory is often a magnetic floppy or hard disk, a magnetic-optical disk, an optical disk, a read-only memory (ROM), such as a compact disk ROM (CD-ROM), electrically programmable ROM (EPROM), or electrically erasable ROM (EEPROM), a magnetic or optical card, or another form of storage for large amounts of data. Some of this data is often written, by a direct memory access process, into memory during execution of software in the computer 2200. The non-volatile storage can be local, remote, or distributed. The non-volatile memory is optional because systems can be created with all applicable data available in memory. A typical computer system will usually include at least a processor, memory, and a device (e.g., a bus) coupling the memory to the processor.

Software is typically stored in the non-volatile memory and/or the drive unit. Indeed, for large programs, it may not even be possible to store the entire program in the memory. Nevertheless, it should be understood that for software to run, if necessary, it is moved to a computer readable location appropriate for processing, and for illustrative purposes, that location is referred to as the memory in this paper. Even when software is moved to the memory for execution, the processor will typically make use of hardware registers to store values associated with the software, and local cache that, ideally, serves to speed up execution. As used herein, a software program is assumed to be stored at any known or convenient location (from non-volatile storage to hardware registers) when the software program is referred to as "implemented in a computer-readable medium". A processor is considered to be "configured to execute a program" when at least one value associated with the program is stored in a register readable by the processor.

The bus also couples the processor to the network interface device. The interface can include one or more of a modem or network interface. It will be appreciated that a modem or network interface can be considered to be part of the computer system. The interface can include an analog modem, an integrated services digital network (ISDN) modem, cable modem, token ring interface, satellite transmission interface (e.g. "direct PC"), or other interfaces for coupling a computer system to other computer systems. The interface can include one or more input and/or output (I/O) devices. The I/O devices can include, by way of example but not limitation, a keyboard, a mouse or other pointing device, disk drives, printers, a scanner, and other input and/or output devices, including a display device. The display device can include, by way of example but not limitation, a cathode ray tube (CRT), liquid crystal display (LCD), or some other applicable known or convenient display device. For simplicity, it is assumed that controllers of any devices not depicted in the example of FIG. 22 reside in the interface.

In operation, the computer system 2200 can be controlled by operating system software that includes a file management system, such as a disk operating system. One example of operating system software with associated file management system software is the family of operating systems known as Windows® from Microsoft Corporation of Redmond, Washington, and their associated file management systems. Another example of operating system software with its associated file management system software is the Linux operating system and its associated file management system. The file management system is typically stored in the non-volatile memory and/or drive unit and causes the processor to execute the various acts required by the operating system to input and output data and to store data in the memory, including storing files on the non-volatile memory and/or drive unit.

As it employed in the subject specification, the term "processing component" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processing component can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions and/or processes described herein. A processing component can exploit nano-scale architectures such as, but not limited to, molecular and quantum-dot based transistors, switches and gates, in order to optimize space usage or enhance performance of components described herein. Further, a processing component can also be implemented as a combination of computing processing units.

In the subject specification, term "memory component" and substantially any other information storage component relevant to operation and functionality of a component and/or process described herein, refer to entities embodied in a "memory," or components comprising the memory. It will be appreciated that a memory component described herein can be either volatile memory or nonvolatile memory, or can include both volatile and nonvolatile memory.

By way of illustration, and not limitation, nonvolatile memory, for example, can be included in ROM, programmable ROM (PROM), EPROM, EPROM, or flash memory. Volatile memory can include RAM, which acts as external cache memory. By way of illustration and not limitation, RAM is available in many forms such as SRAM, DRAM, synchronous DRAM (SDRAM), double data rate SDRAM (DDR SDRAM), enhanced SDRAM (ESDRAM), Synchlink DRAM (SLDRAM), and direct Rambus RAM (DRAM). Additionally, the disclosed memory components of systems or methods herein are intended to comprise, without being limited to comprising, these and any other suitable types of memory.

Aspects of systems, apparatus, and processes explained herein can constitute machine-executable instructions embodied within a machine, e.g., embodied in a computer readable medium (or media) associated with the machine. Such instructions, when executed by the machine, can cause the machine to perform the operations described. Additionally, systems, processes, process blocks, etc. can be embodied within hardware, such as an application specific integrated circuit (ASIC) or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

As another example, a component can be an apparatus with specific functionality provided by mechanical parts operated by electric or electronic circuitry; the electric or electronic circuitry can be operated by a software application or a firmware application executed by one or more processors; the one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Further, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

As used herein, the terms "connected," "coupled," or any variant thereof, means any connection or coupling, either direct or indirect, between two or more elements; the coupling of connection between the elements can be physical, logical, or a combination thereof. Where context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are, at times, shown as being performed in a series, these processes or blocks may instead be performed in parallel, or may be performed at different times. Further, any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A system, comprising:
a processor; and
a memory that stores executable instructions that, when executed by the processor, facilitate performance of operations by the processor, comprising:
receiving, via a thin film transistor (TFT) circuit using a group of antenna elements, respective portions of a wireless signal that has been transmitted by a device;
determining, via the TFT circuit, variants of the respective portions of the wireless signal; and
sending, via the TFT circuit using the group of antenna elements, the variants of the respective portions of the wireless signal directed to the device according to a defined transmission power to deliver power to the device, wherein the power charges a power storage element of the device.

2. The system of claim 1, wherein the determining of the variants comprises:
determining respective phases and respective amplitudes of the respective portions of the wireless signal; and
based on the respective phases and the respective amplitudes, determining the variants of the respective portions of the wireless signal.

3. The system of claim 1, wherein the variants of the respective portions of the wireless signal comprise:
respective radio frequency power waveforms that are sent via respective antenna elements of the group of antenna elements according to determinations of inverse phases of respective phases of the respective portions.

4. The system of claim 1, wherein the group of antenna elements is positioned on a surface of a flat panel substrate.

5. The system of claim 4, wherein the TFT circuit is positioned on the flat panel substrate.

6. The system of claim 5, wherein the flat panel substrate comprises a tile-like flat panel substrate comprising at least one of a ceramic material, a plastic material, a silicon material, a glass material, or a flexible material, and wherein the flexible material comprises at least a defined flexibility.

7. The system of claim 6, wherein the group of antenna elements is on a first side of the flat panel substrate, and wherein the TFT circuit is on a second side of the flat panel substrate that is opposite to the first side.

8. The system of claim 4, wherein the TFT circuit is connected, by way of respective vias within the flat panel substrate, to respective antenna elements of the group of antenna elements.

9. The system of claim 8, wherein the respective vias are shielded from each other to facilitate a reduction of electromagnetic interference comprising at least one of a surface standing wave or a guide standing wave.

10. The system of claim 9, wherein the TFT circuit comprises:
an interface that receives, via an antenna element of the group of antenna elements, a portion of the respective portions of the wireless signal;
a phase detector that determines a phase of the portion and an amplitude of the portion; and
a phase shifter that generates a modified phase based on the phase, wherein a variant of the variants, generated using the modified phase, is sent to the device via the antenna element, and wherein the variant comprises at least one of a variant phase, a variant conjugate phase, a variant complex conjugate phase, or a signal.

11. The system of claim 10, wherein the modified phase is determined to be a determined complex conjugate phase of the phase.

12. The system of claim 10, further comprising:
an antenna management board (AMB) comprising the group of antenna elements, the TFT circuit, and connectors that are arranged at a periphery of the AMB to facilitate a mechanical connection to another AMB.

13. The system of claim 12, further comprising:
a group of AMBs comprising the AMB; and
a controller printed circuit board comprising an antenna control system that is configured to facilitate control of the TFT circuit with respect to a reception of the portion of the respective portions of the wireless signal, a determination of the phase of the portion and the amplitude of the portion, a generation of the modified phase, and a transmission of the variant.

14. The system of claim 13, wherein the antenna control system comprises:
a sensor component that
emits, via the group of antenna elements, respective wireless beacons,
determines respective amplitudes of wireless signals that correspond to the respective wireless beacons and that have been received at the respective antenna elements of the group of antenna elements,
determines respective phases of the wireless signals, and generates, based on the respective amplitudes and the respective phases, an image of at least one of an object or an environment corresponding to the antenna control system.

15. The system of claim 13, wherein the antenna control system comprises:
a sensor component that generates, based on the characteristics of the respective portions of the wireless signal, at least one of an image of an object or an environment corresponding to the antenna control system.

16. A method, comprising:
receiving, from a device by a system comprising a processor via a thin film transistor (TFT) circuit using an array of antenna elements, respective portions of a wireless signal;
determining, by the system via the TFT circuit, variants of the respective portions of the wireless signal corresponding to the array of antenna elements; and
sending, by the system via the TFT circuit using the array of antenna elements, the variants of the respective portions of the wireless signal directed to the device to deliver power to the device.

17. The method of claim 16, wherein the determining of the variants comprises:
determining respective phases and respective amplitudes of the respective portions of the wireless signal; and
based on the respective phases and the respective amplitudes, determining the variants of the respective portions.

18. The method of claim 17, wherein the variants of the respective portions comprise respective radio frequency power waveforms, and wherein the sending further comprises:
sending the variants of the respective portions according to determinations of inverse phases of respective phases of the respective portions.

19. A system, comprising:
an antenna management board (AMB) comprising an array of antenna elements and connectors that are arranged at a periphery of the AMB to facilitate a mechanical connection to another AMB other than the AMB; and
a thin film transistor (TFT) circuit corresponding to an antenna element of the array of antenna elements, wherein the TFT circuit
receives, via the array of antenna elements, respective portions of a wireless signal that has been transmitted by a device,
determines variants of the respective portions of the wireless signals, and
sends, via respective antenna elements of the array of antenna elements, the variants of the respective portions directed to the device according to a defined transmission power to deliver power to the device.

20. The system of claim 19, further comprising:
a group of AMBs comprising the AMB; and
an antenna controller that is configured to facilitate a determination of a phase of the portion and an amplitude of the portion.

* * * * *